(12) United States Patent
Lee et al.

(10) Patent No.: US 11,837,638 B2
(45) Date of Patent: Dec. 5, 2023

(54) SEMICONDUCTOR DEVICE

(71) Applicant: SAMSUNG ELECTRONICS CO., LTD., Suwon-si (KR)

(72) Inventors: Sang Hoon Lee, Seongnam-si (KR); Chang Woo Sohn, Seoul (KR); Keun Hwi Cho, Seoul (KR); Sang Won Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 263 days.

(21) Appl. No.: 17/335,413

(22) Filed: Jun. 1, 2021

(65) Prior Publication Data

US 2022/0115506 A1  Apr. 14, 2022

(30) Foreign Application Priority Data

Oct. 14, 2020  (KR) .................. 10-2020-0132464

(51) Int. Cl.
*H01L 29/417* (2006.01)
*H01L 27/088* (2006.01)
(Continued)

(52) U.S. Cl.
CPC .. *H01L 29/41733* (2013.01); *H01L 21/02603* (2013.01); *H01L 21/28518* (2013.01);
(Continued)

(58) Field of Classification Search
CPC ......... H01L 29/41733; H01L 21/02603; H01L 21/28518; H01L 21/823412; H01L 21/823418; H01L 21/823462; H01L 21/823468; H01L 21/823475; H01L 27/088; H01L 29/0673; H01L 29/42392; H01L 29/45; H01L 29/4908;
(Continued)

(56) References Cited

U.S. PATENT DOCUMENTS

| | | |
|---|---|---|
| 10,038,094 B2 | 7/2018 | Fung |
| 10,084,049 B2 | 9/2018 | Kim et al. |

(Continued)

FOREIGN PATENT DOCUMENTS

| | | |
|---|---|---|
| KR | 10-0652381 B1 | 12/2006 |
| KR | 10-1675121 B1 | 11/2016 |
| KR | 10-2083604 B1 | 3/2020 |

*Primary Examiner* — Tong-Ho Kim
(74) *Attorney, Agent, or Firm* — Lee IP Law, P.C.

(57) ABSTRACT

A semiconductor device includes first and second isolation regions, a first active region extending in a first direction between the first and second isolation regions, a first fin pattern on the first active region, nanowires on the first fin pattern, a gate electrode in a second direction on the first fin pattern, the gate electrode surrounding the nanowires, a first source/drain region on a side of the gate electrode, the first source/drain region being on the first active region and in contact with the nanowires, and a first source/drain contact on the first source/drain region, the first source/drain contact including a first portion on a top surface of the first source/drain region, and a second portion extending toward the first active region along a sidewall of the first source/drain region, an end of the first source/drain contact being on one of the first and second isolation regions.

18 Claims, 25 Drawing Sheets

(51) Int. Cl.
| | |
|---|---|
| *H01L 29/06* | (2006.01) |
| *H01L 29/423* | (2006.01) |
| *H01L 29/45* | (2006.01) |
| *H01L 29/49* | (2006.01) |
| *H01L 29/775* | (2006.01) |
| *H01L 29/78* | (2006.01) |
| *H01L 29/786* | (2006.01) |
| *H01L 21/02* | (2006.01) |
| *H01L 21/285* | (2006.01) |
| *H01L 21/8234* | (2006.01) |
| *H01L 29/66* | (2006.01) |

(52) U.S. Cl.
CPC ........ *H01L 21/823412* (2013.01); *H01L 21/823418* (2013.01); *H01L 21/823462* (2013.01); *H01L 21/823468* (2013.01); *H01L 21/823475* (2013.01); *H01L 27/088* (2013.01); *H01L 29/0673* (2013.01); *H01L 29/42392* (2013.01); *H01L 29/45* (2013.01); *H01L 29/4908* (2013.01); *H01L 29/6684* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/78391* (2014.09); *H01L 29/78618* (2013.01); *H01L 29/78696* (2013.01)

(58) Field of Classification Search
CPC ........ H01L 29/66439; H01L 29/66545; H01L 29/66553; H01L 29/66742; H01L 29/6684; H01L 29/775; H01L 29/78391; H01L 29/78618; H01L 29/78696; H01L 23/485; H01L 23/5283; H01L 27/0207; H01L 29/0847; H01L 29/41725; H01L 21/823481; H01L 29/516; H01L 21/823437; B82Y 10/00
USPC ...................................................... 257/347
See application file for complete search history.

(56) References Cited

U.S. PATENT DOCUMENTS

| | | | |
|---|---|---|---|
| 10,192,819 | B1 | 1/2019 | Chanemougame et al. |
| 10,546,941 | B2 | 1/2020 | Adusumilli et al. |
| 2016/0260669 | A1 | 9/2016 | Paak et al. |
| 2019/0393315 | A1 | 12/2019 | Noh et al. |
| 2020/0111798 | A1 | 4/2020 | Paul et al. |
| 2020/0135724 | A1 | 4/2020 | Lin et al. |
| 2021/0343645 | A1* | 11/2021 | Peng ................. H01L 29/42392 |

* cited by examiner

SEMICONDUCTOR DEVICE

CROSS-REFERENCE TO RELATED APPLICATION

Korean Patent Application No. 10-2020-0132464, filed on Oct. 14, 2020, in the Korean Intellectual Property Office, and entitled: "Semiconductor Device," is incorporated by reference herein in its entirety.

BACKGROUND

1. Field

The present disclosure relates to a semiconductor device. More particularly, the present disclosure relates to a semiconductor device including a multi-bridge channel field effect transistor (MBCFET™).

2. Description of the Related Art

With the recent rapid spread of information media, the functions of semiconductor devices have also rapidly developed. In the case of recent semiconductor products, high integration of the products is required for low cost and high quality in order to gain a competitive edge. For high integration, semiconductor devices have been scaled down in size.

SUMMARY

According to an exemplary embodiment of the present disclosure, there is provided a semiconductor device, including first and second element isolation regions, a first active region disposed between the first element isolation region and the second element isolation region and extending in a first direction, a first fin-shaped pattern extending in the first direction on the first active region, a first plurality of nanowires extending in the first direction on the first fin-shaped pattern, a gate electrode extending in a second direction different from the first direction on the first fin-shaped pattern and surrounding the first plurality of nanowires, a first source/drain region disposed on at least one side of the gate electrode on the first active region and in contact with each of the first plurality of nanowires, and a first source/drain contact disposed on the first source/drain region, the first source/drain contact includes a first portion disposed on a top surface of the first source/drain region and a second portion extending toward the first active region along a sidewall of the first source/drain region, an end of the first source/drain contact in the second direction on a plane defined by the first and second directions is disposed on one of the first and second element isolation regions.

According to an exemplary embodiment of the present disclosure, there is provided a semiconductor device, including first to third element isolation regions, a first active region disposed between the first element isolation region and the second element isolation region and extending in a first direction, a second active region disposed between the second element isolation region and the third element isolation region and extending in the first direction, a first plurality of nanowires extending in the first direction on the first active region, a second plurality of nanowires extending in the first direction on the second active region, a gate electrode extending in a second direction different from the first direction on the first and second active regions and surrounding the first and second plurality of nanowires, a first source/drain contact disposed on at least one side of the gate electrode on the first active region, an end of the first source/drain contact in the second direction on a plane defined by the first and second directions is disposed on one of the first and second element isolation regions, and a second source/drain contact spaced apart from the first source/drain contact in the second direction on the second active region, an end of the second source/drain contact in the second direction on a plane defined by the first and second directions is disposed on one of the second and third element isolation regions.

According to an exemplary embodiment of the present disclosure, there is provided a semiconductor device, including first to third element isolation regions, a first active region disposed between the first element isolation region and the second element isolation region and extending in a first direction, a second active region disposed between the second element isolation region and the third element isolation region and extending in the first direction, a first fin-shaped pattern extending in the first direction on the first active region, a second fin-shaped pattern extending in the first direction on the second active region, a first plurality of nanowires extending in the first direction on the first fin-shaped pattern, a second plurality of nanowires extending in the first direction on the second fin-shaped pattern, a gate electrode extending in a second direction different from the first direction on the first and second fin-shaped patterns and surrounding each of the first and second plurality of nanowires, a first source/drain region disposed on at least one side of the gate electrode on the first active region, a second source/drain region disposed on at least one side of the gate electrode on the second active region, a first source/drain contact disposed on the first source/drain region, an end of the first source/drain contact in the second direction on a plane defined by the first and second directions is disposed on one of the first and second element isolation regions, and a second source/drain contact disposed on the second source/drain region, an end of the second source/drain contact in the second direction on a plane defined by the first and second directions is disposed on one of the second and third element isolation regions, wherein a lowermost surface of the first source/drain contact is formed on the same plane as a bottom surface of the first source/drain region.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, a semiconductor device according to some embodiments of the present disclosure will be described with reference to FIGS. 1 to 4.

Figure 1:
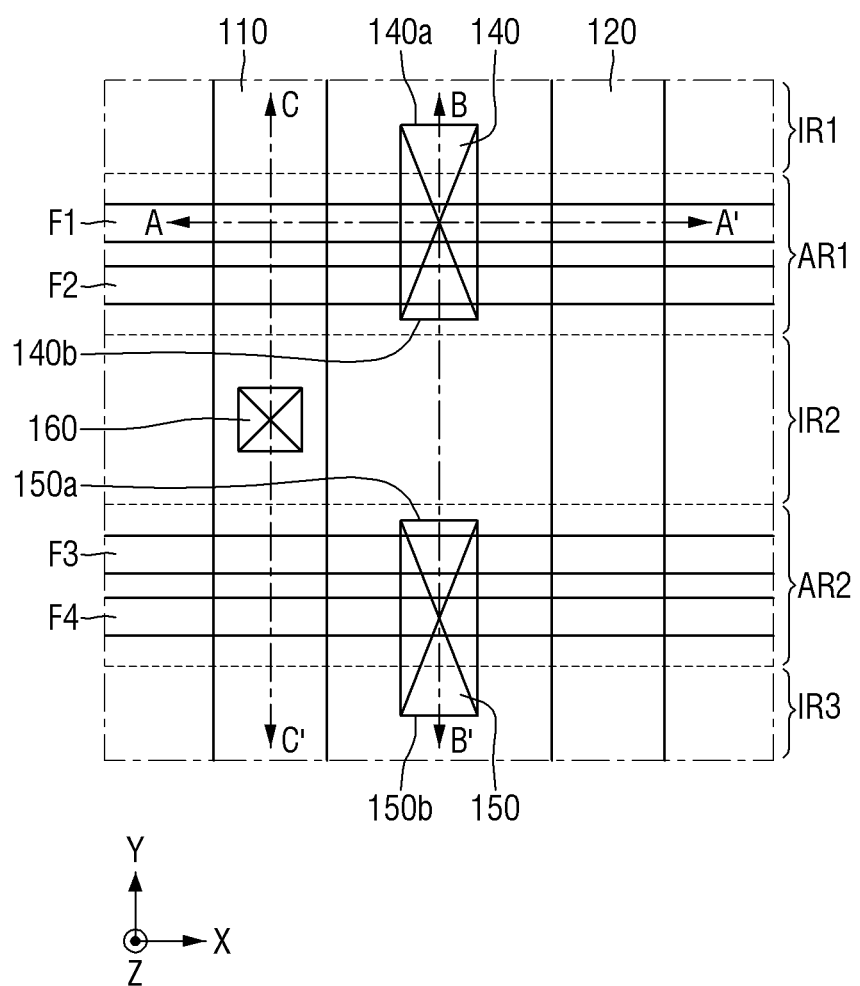
FIG. 1 is a layout diagram illustrating a semiconductor device according to some embodiments of the present disclosure.
Figure 2:
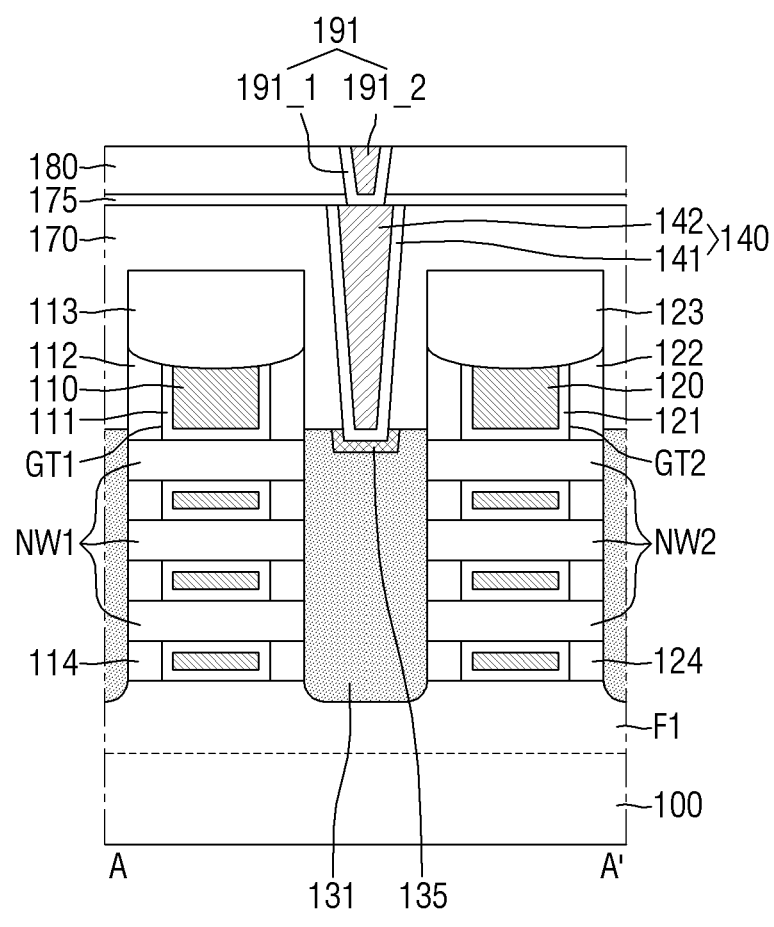
FIG. 2 is a cross-sectional view taken along line A-A' of FIG. 1.
Figure 3:
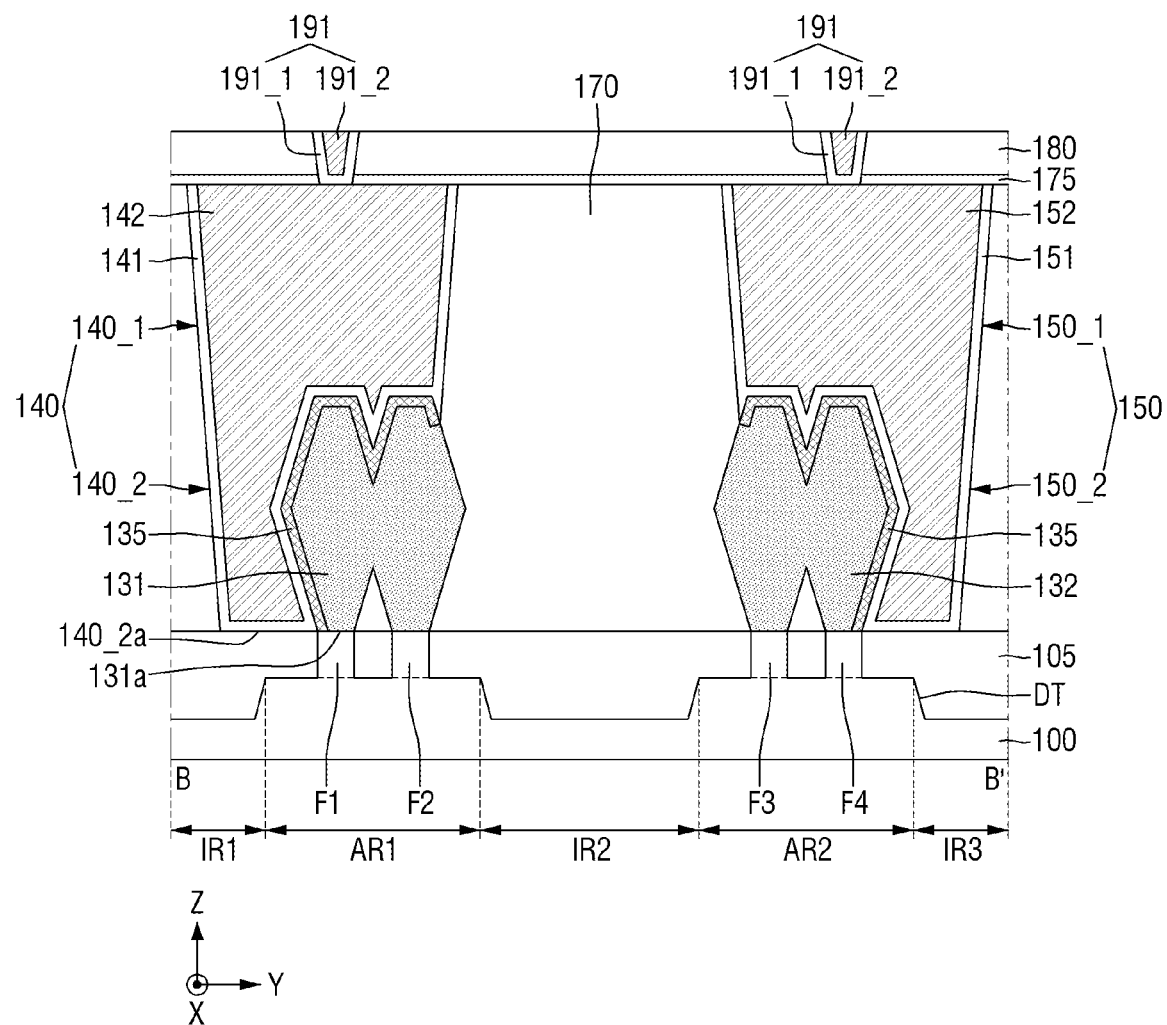
FIG. 3 is a cross-sectional view taken along line B-B' of FIG. 1.
Figure 4:
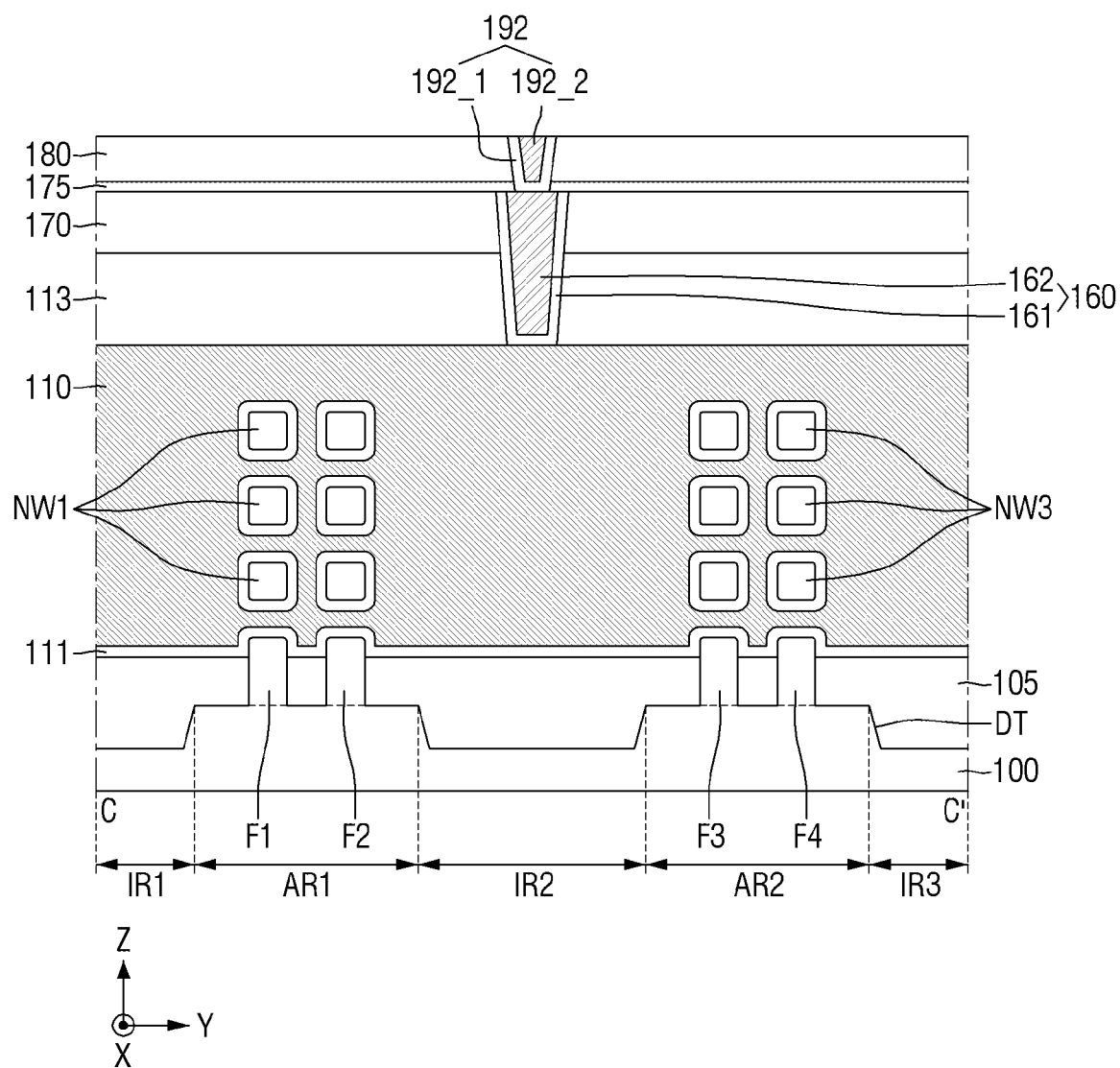
FIG. 4 is a cross-sectional view taken along line C-C' of FIG. 1.

FIG. 1 is a layout diagram illustrating a semiconductor device according to some embodiments of the present disclosure. FIG. 2 is a cross-sectional view taken along line A-A' of FIG. 1. FIG. 3 is a cross-sectional view taken along line B-B' of FIG. 1. FIG. 4 is a cross-sectional view taken along line C-C' of FIG. 1.

Referring to FIGS. 1 to 4, a semiconductor device according to some embodiments of the present disclosure may include a substrate 100, a field insulating layer 105, first to fourth fin-shaped patterns F1, F2, F3, and F4, a first gate structure, a second gate structure, a first source/drain region 131, a second source/drain region 132, a silicide layer 135, a first source/drain contact 140, a second source/drain contact 150, a gate contact 160, a first interlayer insulating layer 170, an etch stop layer 175, a second interlayer insulating layer 180, a first via 191, and a second via 192.

The substrate 100 may include first to third element isolation regions IR1, IR2, and IR3 and first and second active regions AR1 and AR2. The first and second active regions AR1 and AR2 may be defined by the first to third element isolation regions IR1, IR2, and IR3. As shown in FIG. 3, each of the first to third element isolation regions IR1, IR2, and IR3 may be formed in an element isolation trench DT.

Each of the first to third element isolation regions IR1, IR2, and IR3 may extend, e.g., lengthwise in a first direction X. The first to third element isolation regions IR1, IR2, and IR3 may be sequentially spaced apart in a second direction Y different from the first direction X. The first active region AR1 may be disposed between the first element isolation region IR1 and the second element isolation region IR2. The second active region AR2 may be disposed between the second element isolation region IR2 and the third element isolation region IR3. That is, the second element isolation region IR2 may be disposed between the first active region AR1 and the second active region AR2.

The substrate 100 may be a silicon substrate or a silicon-on-insulator (SOI) substrate. Alternatively, the substrate 100 may include, e.g., silicon germanium, silicon germanium on insulator (SGOI), indium antimonide, a lead tellurium compound, indium arsenide, indium phosphide, gallium arsenide, or gallium antimonide, but the present disclosure is not limited thereto.

Each of the first fin-shaped pattern F1 and the second fin-shaped pattern F2 may be disposed in the first active region AR1. Each of the first fin-shaped pattern F1 and the second fin-shaped pattern F2 may extend, e.g., lengthwise, in the first direction X. The first fin-shaped pattern F1 and the second fin-shaped pattern F2 may be spaced apart from each other in the second direction Y. Each of the first fin-shaped pattern F1 and the second fin-shaped pattern F2 may protrude from the substrate 100 in a vertical direction Z.

Each of the third fin-shaped pattern F3 and the fourth fin-shaped pattern F4 may be disposed in the second active region AR2. Each of the third fin-shaped pattern F3 and the fourth fin-shaped pattern F4 may extend, e.g., lengthwise, in the first direction X. The third fin-shaped pattern F3 and the fourth fin-shaped pattern F4 may be spaced apart from each other in the second direction Y. Each of the third fin-shaped pattern F3 and the fourth fin-shaped pattern F4 may protrude from the substrate 100 in the vertical direction Z.

FIG. 1 illustrates that two fin-shaped patterns are disposed in each of the first active region AR1 and the second active region AR2. However, this is merely for simplicity of description and the present disclosure is not limited thereto. One or more fin-shaped patterns may be disposed in each of the first and second active regions AR1 and AR2.

Each of the first to fourth fin-shaped patterns F1, F2, F3, and F4 may be a part of the substrate 100, or may include an epitaxial layer grown from the substrate 100. Each of the first to fourth fin-shaped patterns F1, F2, F3, and F4 may include, e.g., silicon or germanium, which is an elemental semiconductor material. In addition, each of the first to fourth fin-type patterns F1, F2, F3, and F4 may include a compound semiconductor and may include, e.g., a group IV-IV compound semiconductor or a group III-V compound semiconductor.

The group IV-IV compound semiconductor may be a binary compound or a ternary compound including at least two elements of carbon (C), silicon (Si), germanium (Ge) and tin (Sn), or the above-mentioned compound doped with a group IV element. The group III-V compound semiconductor may be, e.g., a binary compound, a ternary compound or a quaternary compound formed by combining at least one of aluminum (Al), gallium (Ga) and indium (In) which are group III elements with one of phosphorus (P), arsenic (As) and antimony (Sb) which are group V elements.

The field insulating layer 105 may be disposed on the substrate 100. The field insulating layer 105 may be disposed across the first to third element isolation regions IR1, IR2, and IR3 and the first and second active regions AR1 and AR2. The field insulating layer 105 may fill the element isolation trench DT defining the first and second active regions AR1 and AR2.

The field insulating layer 105 may be disposed on a part of the sidewall of each of the first to fourth fin-shaped patterns F1, F2, F3, and F4. Each of the first to fourth fin-shaped patterns F1, F2, F3, and F4 may protrude in the vertical direction Z from the top surface of the field insulating layer 105. The field insulating layer 105 may include, e.g., an oxide layer, a nitride layer, an oxynitride layer, or a combination layer thereof.

A plurality of nanowires may be disposed on the first to fourth fin-shaped patterns F1, F2, F3, and F4 in the first and second active regions AR1 and AR2. The plurality of nanowires may include a plurality of nanowires stacked to be spaced apart from each other in the vertical direction Z. In FIG. 2, the plurality of nanowires are shown to include three nanowires stacked to be spaced apart from each other in the vertical direction Z, but this is merely for simplicity of description, and the present disclosure is not limited thereto.

For example, as illustrated in FIGS. 2 and 4, a first plurality of nanowires NW1 may be disposed on the first fin-shaped pattern F1 in the first active region AR1. The first plurality of nanowires NW1 may include three nanowires stacked to be spaced apart from each other in the vertical direction Z. The first plurality of nanowires NW1 may extend in the first direction X.

As illustrated in FIG. 2, a second plurality of nanowires NW2 may be disposed on the first fin-shaped pattern F1 in the first active region AR1. The second plurality of nanowires NW2 may be spaced apart from the first plurality of nanowires NW1 in the first direction X. The second plurality of nanowires NW2 may include three nanowires stacked to be spaced apart from each other in the vertical direction Z. The second plurality of nanowires NW2 may extend in the first direction X. For example, referring to FIGS. 1, 2, and 4, stacks of nanowires may be formed on the second fin-shaped pattern F2 in the first active region AR1 in a same structure described previously with reference to the first and second pluralities of nanowires NW1 and NW2 on the first fin-shaped pattern F1.

A third plurality of nanowires NW3 may be disposed on the fourth fin-shaped pattern F4 in the second active region AR2. The third plurality of nanowires NW3 may be spaced apart from the first plurality of nanowires NW1 in the second direction Y. The third plurality of nanowires NW3 may include three nanowires stacked to be spaced apart from each other in the vertical direction Z. The third plurality of nanowires NW3 may extend in the first direction X. For example, referring to FIGS. 1, 2, and 4, stacks of nanowires may be formed on the third fin-shaped pattern F3 in the second active region AR2 in a same structure described previously with reference to the third plurality of nanowires NW3 on the fourth fin-shaped pattern F4.

The first gate structure may include a first gate electrode 110, a first gate insulating layer 111, a first gate spacer 112, a first capping pattern 113, and a first internal spacer 114. The second gate structure may include a second gate electrode 120, a second gate insulating layer 121, a second gate spacer 122, a second capping pattern 123, and a second internal spacer 124.

Each of the first gate structure and the second gate structure may, e.g., lengthwise, in the second direction Y over the first to third element isolation regions IR1, IR2, and IR3 and the first and second active regions AR1 and AR2. The second gate structure may be spaced apart from the first gate structure in the first direction X.

The first gate electrode 110 may be disposed in a first gate trench GT1 defined by the first gate spacers 112. The first gate electrode 110 may extend, e.g., lengthwise, in the second direction Y. The first gate electrode 110 may be disposed, e.g., continuously, on the field insulating layer 105 and the first to fourth fin-shaped patterns F1, F2, F3, and F4. The first gate electrode 110 may cross each of the first to fourth fin-shaped patterns F1, F2, F3, and F4. The first gate electrode 110 may surround each of the first plurality of nanowires NW1 and the third plurality of nanowires NW3.

It is depicted that the first gate electrode 110 is disposed over the two active regions AR1 and AR2, but this is merely for simplicity of description and the present disclosure is not limited thereto. In some other embodiments, the first gate electrode 110 may be divided into two parts to be disposed on the two active regions AR1 and AR2, respectively.

The second gate electrode 120 may be disposed in a second gate trench GT2 defined by the second gate spacers 122. The second gate electrode 120 may extend, e.g., lengthwise, in the second direction Y. The second gate electrode 120 may be disposed, e.g., continuously, on the field insulating layer 105 and the first to fourth fin-shaped patterns F1, F2, F3, and F4. The second gate electrode 120 may cross each of the first to fourth fin-shaped patterns F1, F2, F3, and F4. The second gate electrode 120 may surround the second plurality of nanowires NW2.

It is depicted that the second gate electrode 120 is disposed over the two active regions AR1 and AR2, but this is merely for simplicity of description and the present disclosure is not limited thereto. In some other embodiments, the second gate electrode 120 may be divided into two parts to be disposed on the two active regions AR1 and AR2, respectively.

Each of the first gate electrode 110 and the second gate electrode 120 may include, e.g., at least one of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC—N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni—Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. Each of the first gate electrode 110 and the second gate electrode 120 may include conductive metal oxide, conductive metal oxynitride or the like, and may include an oxidized form of the aforementioned material.

The first gate insulating layer 111 may be disposed in the first gate trench GT1 along the sidewall and bottom surface of the first gate trench GT1. In addition, the first gate insulating layer 111 may be disposed between the first gate electrode 110 and each of the first to fourth fin-shaped patterns F1, F2, F3, and F4, between the first gate electrode 110 and the first plurality of nanowires NW1, between the first gate electrode 110 and the third plurality of nanowires NW3, and between the first gate electrode 110 and the first internal spacer 114. The first gate electrode 110 may fill the inside of the first gate trench GT1, on the first gate insulating layer 111.

The second gate insulating layer 121 may be disposed in the second gate trench GT2 along the sidewall and bottom surface of the second gate trench GT2. In addition, the second gate insulating layer 121 may be disposed between the second gate electrode 120 and each of the first to fourth fin-shaped patterns F1, F2, F3, and F4, between the second gate electrode 120 and the second plurality of nanowires NW2, and between the second gate electrode 120 and the second internal spacer 124. The second gate electrode 120 may fill the inside of the second gate trench GT2, on the second gate insulating layer 121.

Each of the first gate insulating layer 111 and the second gate insulating layer 121 may include, e.g., silicon oxide, silicon oxynitride, silicon nitride, or a high dielectric constant material having a dielectric constant greater than that of silicon oxide. The high dielectric constant material may include, e.g., at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate.

A semiconductor device according to some other embodiments may include a negative capacitance field effect transistor (NCFET) using a negative capacitor. For example, each of the first gate insulating layer 111 and the second gate insulating layer 121 may include a ferroelectric material layer having ferroelectric properties and a paraelectric material layer having paraelectric properties.

The ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. On the other hand, when at least one of the capacitances of two or more capacitors connected in series has a negative value, the total capacitance may have a positive value and may be greater than the absolute value of each capacitance.

When a ferroelectric material layer having a negative capacitance and a paraelectric material layer having a positive capacitance are connected in series, the total capacitance value of the ferroelectric material layer and the paraelectric material layer connected in series may increase. By using an increase in the total capacitance value, the transistor including the ferroelectric material layer may have a subthreshold swing (SS) less than 60 mV/decade at room temperature.

The ferroelectric material layer may have ferroelectric properties. The ferroelectric material layer may include, e.g., at least one of hafnium oxide, hafnium zirconium oxide, barium strontium titanium oxide, barium titanium oxide, or lead zirconium titanium oxide. In this case, as one example, the hafnium zirconium oxide may be a material containing hafnium oxide doped with zirconium (Zr). As another example, the hafnium zirconium oxide may be a compound of hafnium (Hf), zirconium (Zr), and oxygen (O).

The ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, e.g., at least one of gadolinium (Gd), silicon (Si), zirconium (Zr), aluminum (Al), or yttrium (Y).

When the dopant is aluminum (Al), the ferroelectric material layer may include 3 atomic percent (at %) to 8 atomic percent (at %) of aluminum. In this case, the ratio of the dopant may be a ratio of aluminum to the sum of hafnium and aluminum.

When the dopant is silicon (Si), the ferroelectric material layer may include 2 at % to 10 at % of silicon. When the dopant is yttrium (Y), the ferroelectric material layer may include 2 at % to 10 at % of yttrium. When the dopant is gadolinium (Gd), the ferroelectric material layer may include 1 at % to 7 at % of gadolinium. When the dopant is zirconium (Zr), the ferroelectric material layer may include 50 at % to 80 at % of zirconium.

The paraelectric material layer may have paraelectric properties. The paraelectric material layer may include, e.g., at least one of silicon oxide or metal oxide having a high dielectric constant. The metal oxide included in the paraelectric material layer may include, e.g., at least one of hafnium oxide, zirconium oxide, or aluminum oxide, but is not limited thereto.

The ferroelectric material layer and the paraelectric material layer may include the same material. The ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

The ferroelectric material layer may have a thickness that exhibits ferroelectric properties. The thickness of the ferroelectric material layer may be, e.g., in a range of 0.5 nm to 10 nm, but is not limited thereto. Since a critical thickness at which each ferroelectric material exhibits ferroelectric properties may be different, the thickness of the ferroelectric material layer may vary depending on the ferroelectric material.

As one example, each of the first gate insulating layer 111 and the second gate insulating layer 121 may include one ferroelectric material layer. As another example, each of the first gate insulating layer 111 and the second gate insulating layer 121 may include a plurality of ferroelectric material layers spaced apart from each other. Each of the first gate insulating layer 111 and the second gate insulating layer 121 may have a stacked layer structure in which a plurality of ferroelectric material layers and a plurality of paraelectric material layers are alternately stacked.

The first gate spacers 112 may extend along both sidewalls of the first gate electrode 110 in the second direction Y. The first gate spacers 112 may define the first gate trench GT1. The second gate spacers 122 may extend along both sidewalls of the second gate electrode 120 in the second direction Y. The second gate spacers 122 may define the second gate trench GT2.

Each of the first gate spacer 112 and the second gate spacer 122 may include, e.g., at least one of silicon nitride (SiN), silicon oxynitride (SiON), silicon oxide ($SiO_2$), silicon oxycarbonitride (SiOCN), silicon boron nitride (SiBN), silicon oxyboron nitride (SiOBN), silicon oxycarbide (SiOC), or a combination thereof.

For example, the first internal spacer 114 may be disposed between the first gate electrode 110 and the first source/drain region 131, and between the first fin-shaped pattern F1 and the first plurality of nanowires NW1. For example, the second internal spacer 124 may be disposed between the second gate electrode 120 and the first source/drain region 131, and between the first fin-shaped pattern F1 and the second plurality of nanowires NW2. Each of the first internal spacer 114 and the second internal spacer 124 may include, e.g., at least one of silicon nitride (SiN), silicon oxynitride (SiON), silicon oxide (SiO$_2$), silicon oxynitride (SiOCN), silicon boron nitride (SiBN), silicon oxyboron nitride (SiOBN), silicon oxycarbide (SiOC), or a combination thereof.

The first capping pattern 113 may extend in the second direction Y on the first gate electrode 110, the first gate insulating layer 111, and the first gate spacers 112. The bottom surface of the first capping pattern 113 may be formed to be convex toward the first gate electrode 110. However, the present disclosure is not limited thereto.

The second capping pattern 123 may extend in the second direction Y on the second gate electrode 120, the second gate insulating layer 121, and the second gate spacers 122. The bottom surface of the second capping pattern 123 may be formed to be convex toward the second gate electrode 120. However, the present disclosure is not limited thereto.

Each of the first capping pattern 113 and the second capping pattern 123 may include, e.g., at least one of silicon nitride (SiN), silicon oxynitride (SiON), silicon oxide (SiO$_2$), silicon carbonitride (SiCN), silicon oxycarbonitride (SiOCN), or a combination thereof.

The first source/drain region 131 may be disposed at at least one side of the first gate electrode 110, on the first active region AR1. For example, the first source/drain region 131 may be disposed between the first gate electrode 110 and the second gate electrode 120, on the first active region AR1. The first source/drain region 131 may contact each of the nanowires included in the first plurality of nanowires NW1. In addition, the first source/drain region 131 may contact each of the nanowires included in the second plurality of nanowires NW2.

The second source/drain region 132 may be disposed at at least one side of the first gate electrode 110, on the second active region AR2. For example, the second source/drain region 132 may be disposed between the first gate electrode 110 and the second gate electrode 120, on the second active region AR2. The second source/drain region 132 may contact each of the nanowires included in the third plurality of nanowires NW3.

In FIG. 3, the cross section of each of the first and second source/drain regions 131 and 132 in the second direction Y is shown to have a hexagonal shape, but the present disclosure is not limited thereto. In some other embodiments, the cross section of each of the first and second source/drain regions 131 and 132 in the second direction Y may have a pentagonal shape.

The first source/drain contact 140 may be disposed on the first source/drain region 131. The first source/drain contact 140 may be disposed on the first active region AR1. On a plane defined by the first direction X and the second direction Y, the end of the first source/drain contact 140 in the second direction Y may be disposed on any one of the first element isolation region IR1 and the second element isolation region IR2.

For example, the first source/drain contact 140 may be disposed on the first element isolation region IR1 and the first active region AR1. A first end 140a of the first source/drain contact 140 in the second direction Y may be disposed on the first element isolation region IR1. A second end 140b of the first source/drain contact 140 opposite to the first end 140a thereof in the second direction Y may be disposed on the first active region AR1.

The first source/drain contact 140 may include a first portion 140_1 and a second portion 140_2. The first portion 140_1 of the first source/drain contact 140 may be disposed on the top surface of the first source/drain region 131. The second portion 140_2 of the first source/drain contact 140 may extend from the first portion 140_1 of the first source/drain contact 140 toward the first active region AR1 along the sidewall of the first source/drain region 131. For example, as illustrated in FIG. 3, the second portion 140_2 of the first source/drain contact 140 may extend from the first portion 140_1 of the first source/drain contact 140 along the entire sidewall of the first source/drain region 131, e.g., to directly contact the field insulating layer 105. For example, as illustrated in FIG. 3, the second portion 140_2 of the first source/drain contact 140 may overlap, e.g., cover, the, e.g., entire, sidewall of the first source/drain region 131.

For example, a bottom surface 140_2a of the second portion 140_2 of the first source/drain contact 140 may extend to the field insulating layer 105. That is, the bottom surface 140_2a of the second portion 140_2 of the first source/drain contact 140 may be formed on the same plane as (e.g., coplanar with) a bottom surface 131a of the first source/drain region 131, e.g., is, the bottom surface 140_2a of the second portion 140_2 and the bottom surface 131a of the first source/drain region 131 may be level with each other. However, the present disclosure is not limited thereto. In some other embodiments, the bottom surface 140_2a of the second portion 140_2 of the first source/drain contact 140 may be spaced apart from the field insulating layer 105 in the vertical direction Z. At least a part of the first portion 140_1 of the first source/drain contact 140 and at least a part of the second portion 140_2 of the first source/drain contact 140 may each overlap the first element isolation region IR1 in the vertical direction Z.

For example, the sidewall of the second portion 140_2 of the first source/drain contact 140 adjacent to the first source/drain region 131 may be disposed along the profile of the sidewall of the first source/drain region 131. However, the present disclosure is not limited thereto.

The first source/drain contact 140 may include a first contact barrier layer 141 and a first contact filling layer 142. The first contact barrier layer 141 may form the sidewall and the bottom surface of the first source/drain contact 140. The first contact filling layer 142 may be disposed on the first contact barrier layer 141.

The first contact barrier layer 141 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh). The first contact filling layer 142 may include at least one of, e.g., aluminum (Al), tungsten (W), cobalt (Co), ruthenium (Ru), or molybdenum (Mo).

The second source/drain contact 150 may be disposed on the second source/drain region 132. The second source/drain contact 150 may be disposed on the second active region AR2. On a plane defined by the first direction X and the second direction Y, the end of the second source/drain contact 150 in the second direction Y may be disposed on any one of the second element isolation region IR2 and the third element isolation region IR3.

For example, the second source/drain contact 150 may be disposed on the third element isolation region IR3 and the second active region AR2. A first end 150a of the second source/drain contact 150 in the second direction Y may be disposed on the second active region AR2. A second end 150b of the second source/drain contact 150 opposite to the first end 150a thereof in the second direction Y may be disposed on the third element isolation region IR3.

The second source/drain contact 150 may include a first portion 150_1 and a second portion 150_2. The first portion 150_1 of the second source/drain contact 150 may be disposed on the top surface of the second source/drain region 132. The second portion 150_2 of the second source/drain contact 150 may extend from the first portion 150_1 of the second source/drain contact 150 toward the second active region AR2 along the sidewall of the second source/drain region 132. For example, as illustrated in FIG. 3, the second portion 150_2 of the second source/drain contact 150 may extend from the first portion 150_1 of the second source/drain contact 150 along the entire sidewall of the second source/drain region 132, e.g., to directly contact the field insulating layer 105. For example, as illustrated in FIG. 3, the second portion 150_2 of the second source/drain contact 150 and the second portion 140_2 of the first source/drain contact 140 may be arranged symmetrically with respect to the second element isolation region IR2.

For example, the bottom surface of the second portion 150_2 of the second source/drain contact 150 may extend to the field insulating layer 105. That is, the bottom surface of the second portion 150_2 of the second source/drain contact 150 may be formed on the same plane as the bottom surface of the second source/drain region 132. However, the present disclosure is not limited thereto. In some other embodiments, the bottom surface of the second portion 150_2 of the second source/drain contact 150 may be spaced apart from the field insulating layer 105 in the vertical direction Z. At least a part of the first portion 150_1 of the second source/drain contact 150 and at least a part of the second portion 150_2 of the second source/drain contact 150 may each overlap the third element isolation region IR3 in the vertical direction Z.

For example, the sidewall of the second portion 150_2 of the second source/drain contact 150 adjacent to the second source/drain region 132 may be disposed along the profile of the sidewall of the second source/drain region 132. However, the present disclosure is not limited thereto.

The second source/drain contact 150 may include a second contact barrier layer 151 and a second contact filling layer 152. The second contact barrier layer 151 may form the sidewall and the bottom surface of the second source/drain contact 150. The second contact filling layer 152 may be disposed on the second contact barrier layer 151.

The second contact barrier layer 151 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh). The second contact filling layer 152 may include at least one of, e.g., aluminum (Al), tungsten (W), cobalt (Co), ruthenium (Ru), or molybdenum (Mo).

The silicide layer 135 may be disposed between the first source/drain region 131 and the first source/drain contact 140. The silicide layer 135 may be disposed along the profile of a boundary surface between the first source/drain region 131 and the first source/drain contact 140. In addition, the silicide layer 135 may be disposed between the second source/drain region 132 and the second source/drain contact 150. The silicide layer 135 may be disposed along the profile of a boundary surface between the second source/drain region 132 and the second source/drain contact 150. The silicide layer 135 may include, e.g., a metal silicide material.

The first interlayer insulating layer 170 may be disposed on the field insulating layer 105, the first source/drain region 131, and the second source/drain region 132. For example, the first interlayer insulating layer 170 may be disposed to cover the top surface of each of the first capping pattern 113 and the second capping pattern 123, but the present disclosure is not limited thereto. In some other embodiments, the top surface of the first interlayer insulating layer 170 may be formed on the same plane as the top surface of each of the first capping pattern 113 and the second capping pattern 123.

The first interlayer insulating layer 170 may include, e.g., at least one of silicon oxide, silicon nitride, silicon oxynitride, or a low dielectric constant material. The low dielectric constant material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilyl phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

The etch stop layer 175 may be disposed on the first interlayer insulating layer 170. Although it is depicted in FIGS. 2 to 4 that the etch stop layer 175 is formed as a single layer, the present disclosure is not limited thereto. In some other embodiments, the etch stop layer 175 may be formed as a multilayer. The etch stop layer 175 may include, e.g., at least one of silicon oxide, silicon nitride, silicon oxynitride, or a low dielectric constant material.

The gate contact 160 may be connected to the first gate electrode 110 by penetrating the first capping pattern 113 and the first interlayer insulating layer 170 in the vertical direction Z. In FIG. 1, the gate contact 160 is shown to be disposed on the second element isolation region IR2, but this is merely for simplicity of description, and the present disclosure is not limited thereto. In some other embodiments, the gate contact 160 may be disposed on any one of the first active region AR1 and the second active region AR2.

The gate contact 160 may include a third contact barrier layer 161 and a third contact filling layer 162. The third contact barrier layer 161 may form the sidewall and the bottom surface of the gate contact 160. The third contact filling layer 162 may be disposed on the third contact barrier layer 161.

The third contact barrier layer 161 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), tungsten carbonitride (WCN), zirconium (Zr), zirconium nitride (ZrN), vanadium (V), vanadium nitride (VN), niobium (Nb), niobium nitride (NbN), platinum (Pt), iridium (Ir), or rhodium (Rh). The third contact filling layer 162 may include at least one of, e.g., aluminum (Al), tungsten (W), cobalt (Co), ruthenium (Ru), or molybdenum (Mo).

The second interlayer insulating layer 180 may be disposed on the etch stop layer 175. The second interlayer insulating layer 180 may include, e.g., at least one of silicon oxide, silicon nitride, silicon oxynitride, or a low dielectric constant material. The low dielectric constant material may include, e.g., fluorinated tetraethylorthosilicate (FTEOS), hydrogen silsesquioxane (HSQ), bis-benzocyclobutene (BCB), tetramethylorthosilicate (TMOS), octamethylcyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), Tonen Silazene (TOSZ), fluoride silicate glass (FSG), polyimide nanofoams such as polypropylene oxide, carbon doped silicon oxide (CDO), organo silicate glass (OSG), SiLK, amorphous fluorinated carbon, silica aerogels, silica xerogels, mesoporous silica, or a combination thereof, but the present disclosure is not limited thereto.

The first via 191 may penetrate the second interlayer insulating layer 180 and the etch stop layer 175 in the vertical direction Z to be connected to each of the first source/drain contact 140 and the second source/drain contact 150. The first via 191 may include a first via barrier layer 191_1 and a first via filling layer 191_2 disposed on the first via barrier layer 191_1.

The second via 192 may penetrate the second interlayer insulating layer 180 and the etch stop layer 175 in the vertical direction Z to be connected to the gate contact 160. The second via 192 may include a second via barrier layer 192_1 and a second via filling layer 192_2 disposed on the second via barrier layer 192_1.

Each of the first via barrier layer 191_1 and the second via barrier layer 192_1 may include at least one of, e.g., tantalum (Ta), tantalum nitride (TaN), titanium (Ti), titanium nitride (TiN), ruthenium (Ru), cobalt (Co), nickel (Ni), nickel boron (NiB), tungsten (W), tungsten nitride (WN), zirconium (Zr), zirconium nitride (ZrN), vanadium (V), vanadium nitride (VN), niobium (Nb), niobium nitride (NbN), platinum (Pt), iridium (Ir), or rhodium (Rh). Each of the first via filling layer 191_2 and the second via filling layer 192_2 may include, e.g., at least one of aluminum (Al), copper (Cu), tungsten (W), cobalt (Co), ruthenium (Ru), or molybdenum (Mo).

In the semiconductor device according to some embodiments of the present disclosure, the flow of current may be improved by extending at least a part of the source/drain contact to the element isolation region in a multi-bridge channel field effect transistor (MBCFET™) structure, thereby improving the performance of the semiconductor device.

Hereinafter, a semiconductor device according to some other embodiments of the present disclosure will be described with reference to FIGS. 5 and 6. Differences relative to the semiconductor device shown in FIGS. 1 to 4 will be mainly described.

Figure 5:
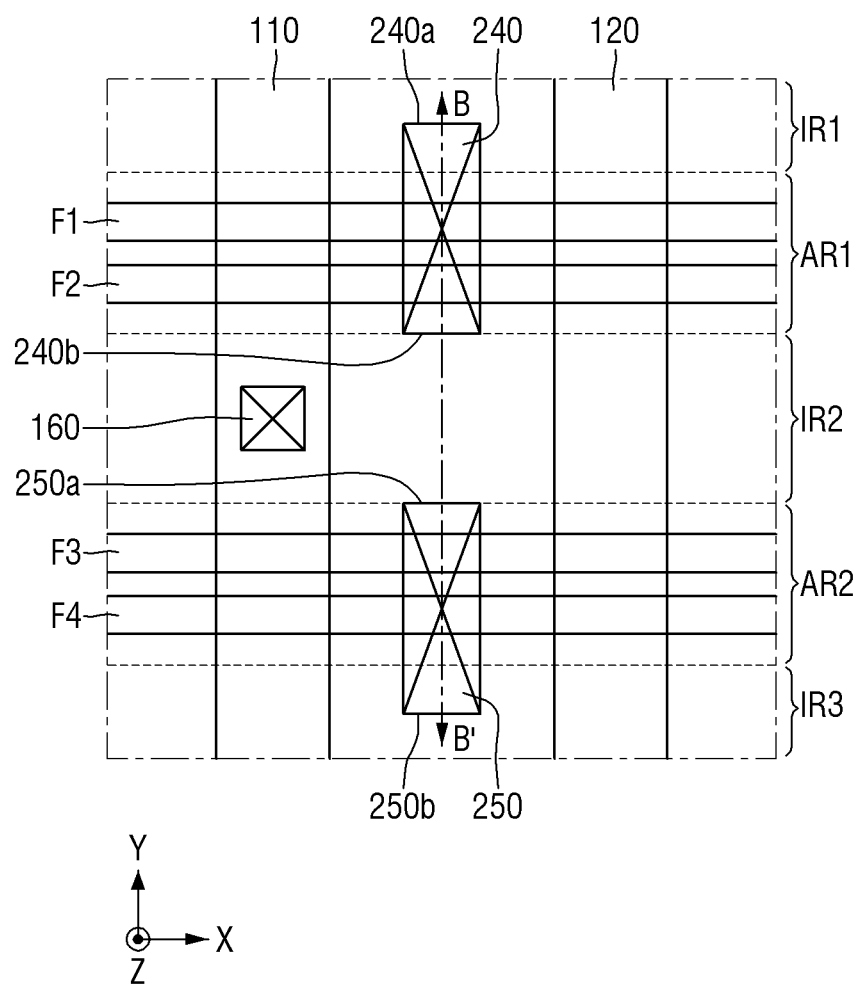
FIG. 5 is a layout diagram illustrating a semiconductor device according to some other embodiments of the present disclosure.

FIG. 5 is a layout diagram illustrating a semiconductor device according to some other embodiments of the present disclosure. FIG. 6 is a cross-sectional view taken along line B-B' of FIG. 5.

Figure 6:
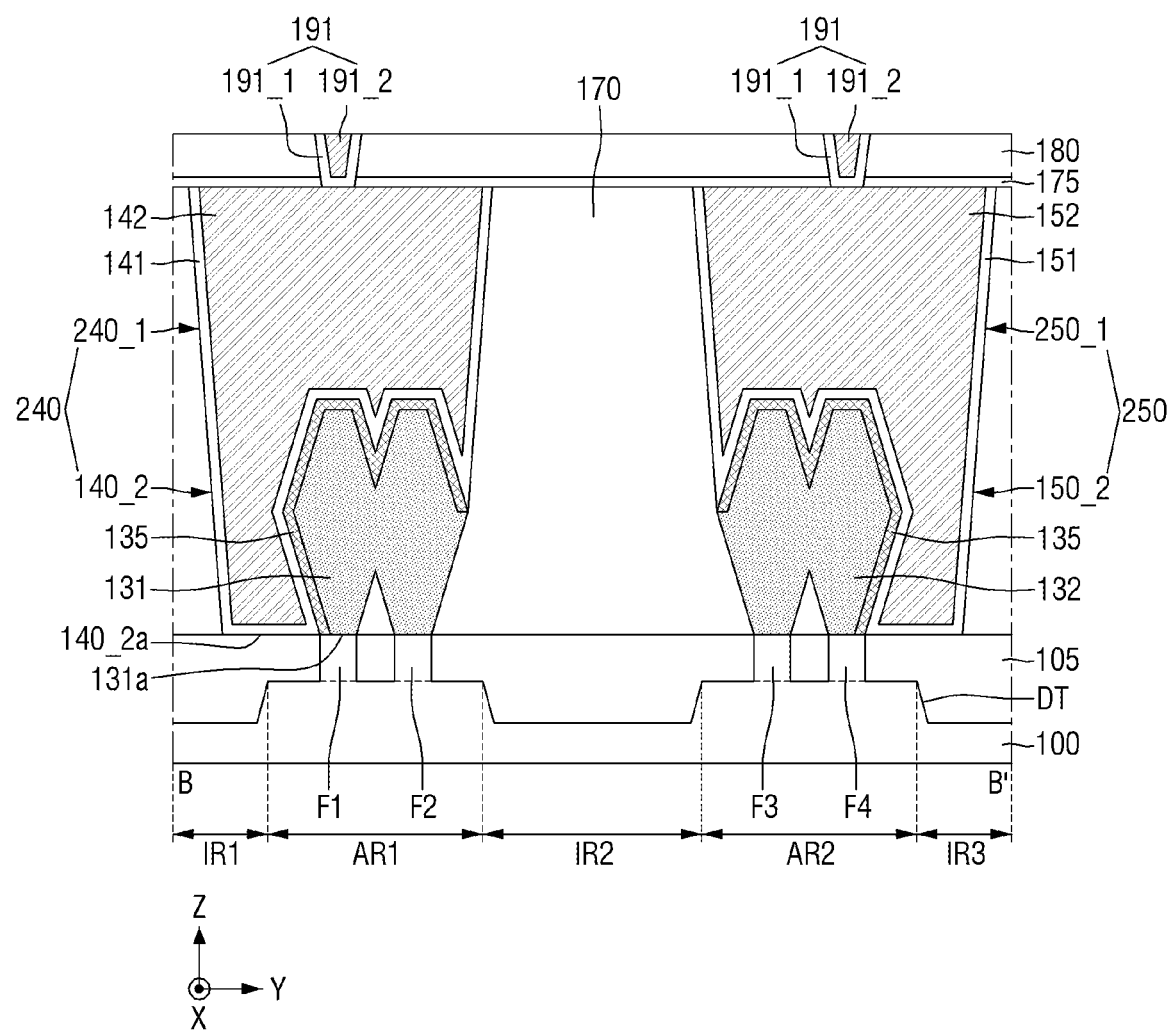
FIG. 6 is a cross-sectional view taken along line B-B' of FIG. 5.

Referring to FIGS. 5 and 6, in a semiconductor device according to some other embodiments of the present disclosure, a second end 240*b* of a first source/drain contact 240 may be aligned with the first active region AR1, and a first end 250*a* of a source/drain contact 250 may be aligned with the second active region AR2.

A first end 240*a* of the first source/drain contact 240 may be disposed on the first element isolation region IR1, and a second end 250*b* of the second source/drain contact 250 may be disposed on the third isolation region IR3. The second end 240*b* of the first source/drain contact 240 may be disposed on a boundary line between the first active region AR1 and the second element isolation region IR2. The first end 250*a* of the second source/drain contact 250 may be disposed on a boundary line between the second active region AR2 and the second element isolation region IR2.

A first portion 240_1 of the first source/drain contact 240 may completely cover the top surface of the first source/drain region 131, e.g., the first portion 240_1 may completely cover the surface of the first source/drain region 131 above the widest part of the first source/drain region 131. A first portion 250_1 of the second source/drain contact 250 may completely cover the top surface of the second source/drain region 132, e.g., the first portion 250_1 may completely cover the surface of the second source/drain region 132 above the widest part of the second source/drain region 132.

Hereinafter, a semiconductor device according to still other embodiments of the present disclosure will be described with reference to FIGS. 7 and 8. Differences relative to the semiconductor device shown in FIGS. 1 to 4 will be mainly described.

Figure 7:
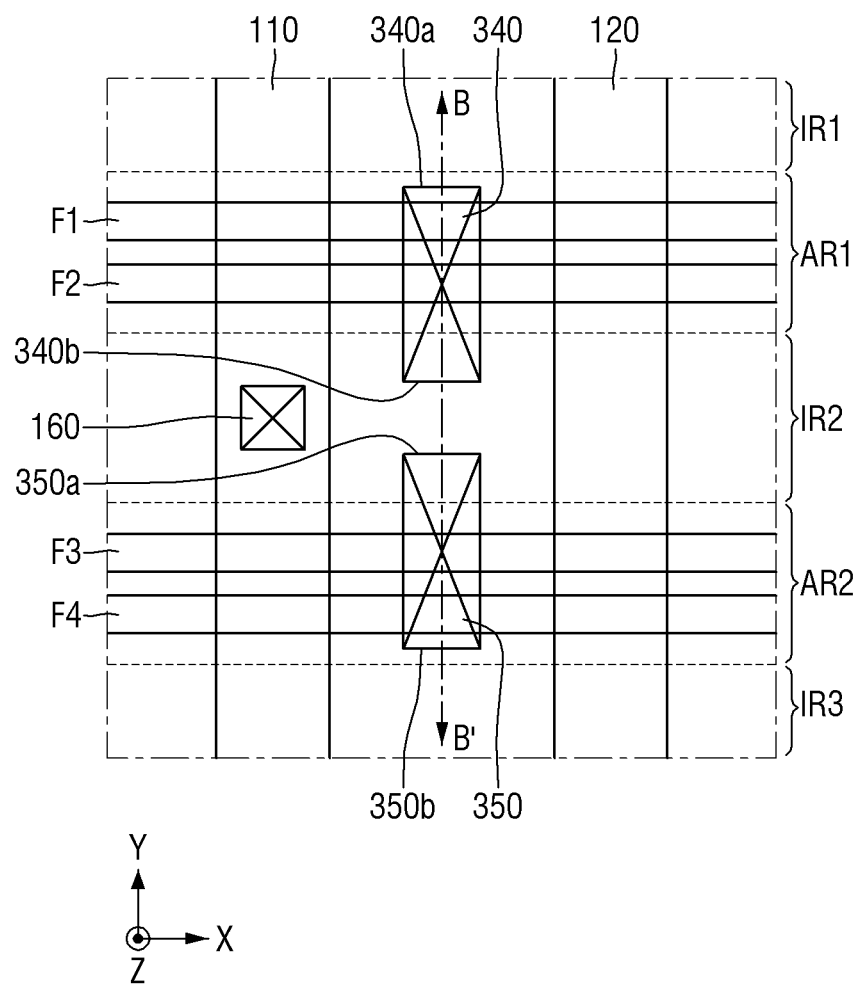
FIG. 7 is a layout diagram illustrating a semiconductor device according to still other embodiments of the present disclosure.

FIG. 7 is a layout diagram illustrating a semiconductor device according to still other embodiments of the present disclosure. FIG. 8 is a cross-sectional view taken along line B-B' of FIG. 7.

Figure 8:
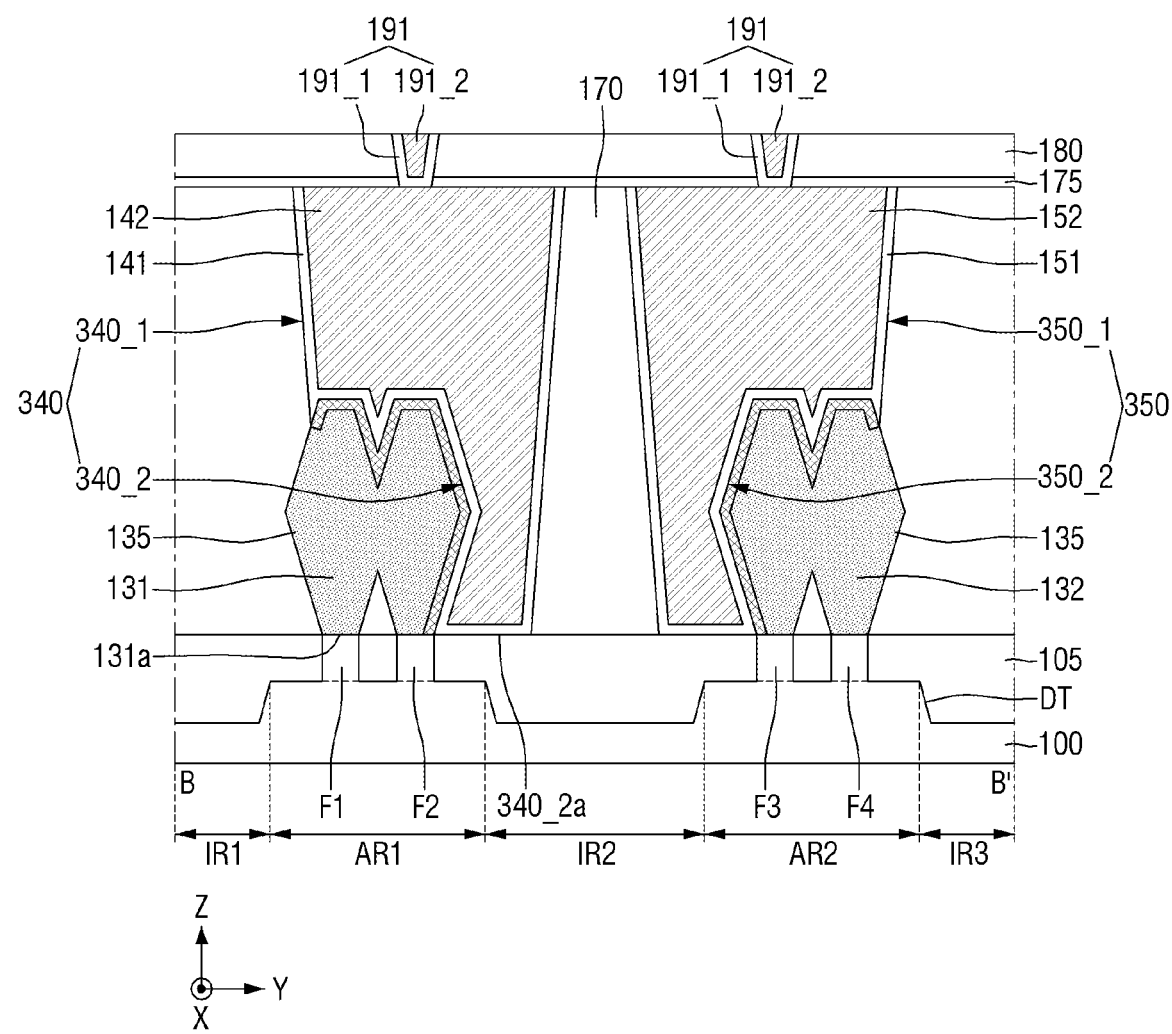
FIG. 8 is a cross-sectional view taken along line B-B' of FIG. 7.

Referring to FIGS. 7 and 8, in a semiconductor device according to still other embodiments of the present disclosure, a second end 340*b* of a first source/drain contact 340 and a first end 350*a* of a second source/drain contact 350 may be disposed on the second element isolation region IR2. A first end 340*a* of the first source/drain contact 340 may be disposed on the first active region AR1, and a second end 350*b* of the second source/drain contact 350 may be disposed on the second active region AR2.

At least a part of a first portion 340_1 of the first source/drain contact 340 and at least a part of a second portion 340_2 of the first source/drain contact 340 may each overlap the second element isolation region IR2 in the vertical direction Z. At least a part of a first portion 350_1 of the second source/drain contact 350 and at least a part of a second portion 350_2 of the second source/drain contact 350 may each overlap the second element isolation region IR2 in the vertical direction Z. For example, as illustrated in FIG. 8, the first and second source/drain contacts 340 and 350 may be on facing sidewalls of the first and second source/drain regions 131 and 132, respectively.

Hereinafter, a semiconductor device according to still other embodiments of the present disclosure will be described with reference to FIG. 9. Differences relative to the semiconductor device shown in FIGS. 1 to 4 will be mainly described.

Figure 9:
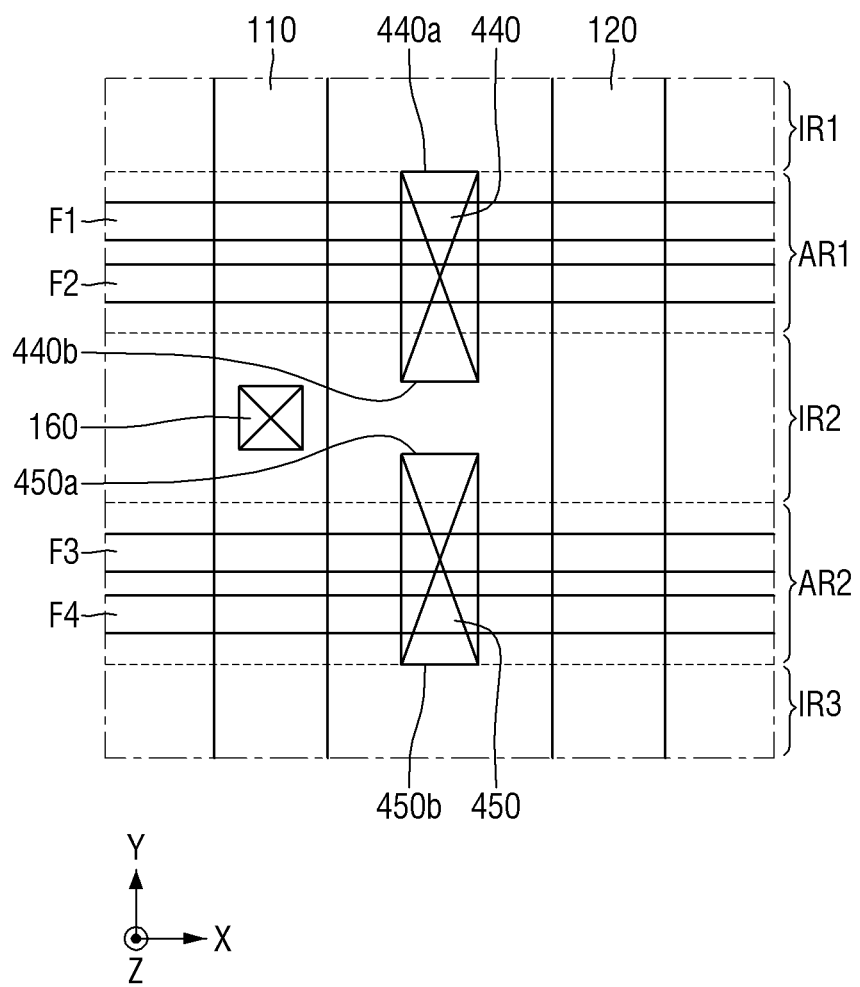
FIG. 9 is a layout diagram illustrating a semiconductor device according to still other embodiments of the present disclosure.

FIG. 9 is a layout diagram illustrating a semiconductor device according to still other embodiments of the present disclosure.

Referring to FIG. 9, in a semiconductor device according to still other embodiments of the present disclosure, a second end 440*b* of a first source/drain contact 440 and a first end 450*a* of a second source/drain contact 450 may be disposed on the second element isolation region IR2. A first end 440*a* of the first source/drain contact 440 may be disposed on a boundary line between the first active region AR1 and the first element isolation region IR1. A second end 450*b* of the second source/drain contact 450 may be disposed on a boundary line between the second active region AR2 and the third element isolation region IR3.

Hereinafter, a semiconductor device according to still other embodiments of the present disclosure will be described with reference to FIG. 10. Differences relative to the semiconductor device shown in FIGS. 1 to 4 will be mainly described.

Figure 10:
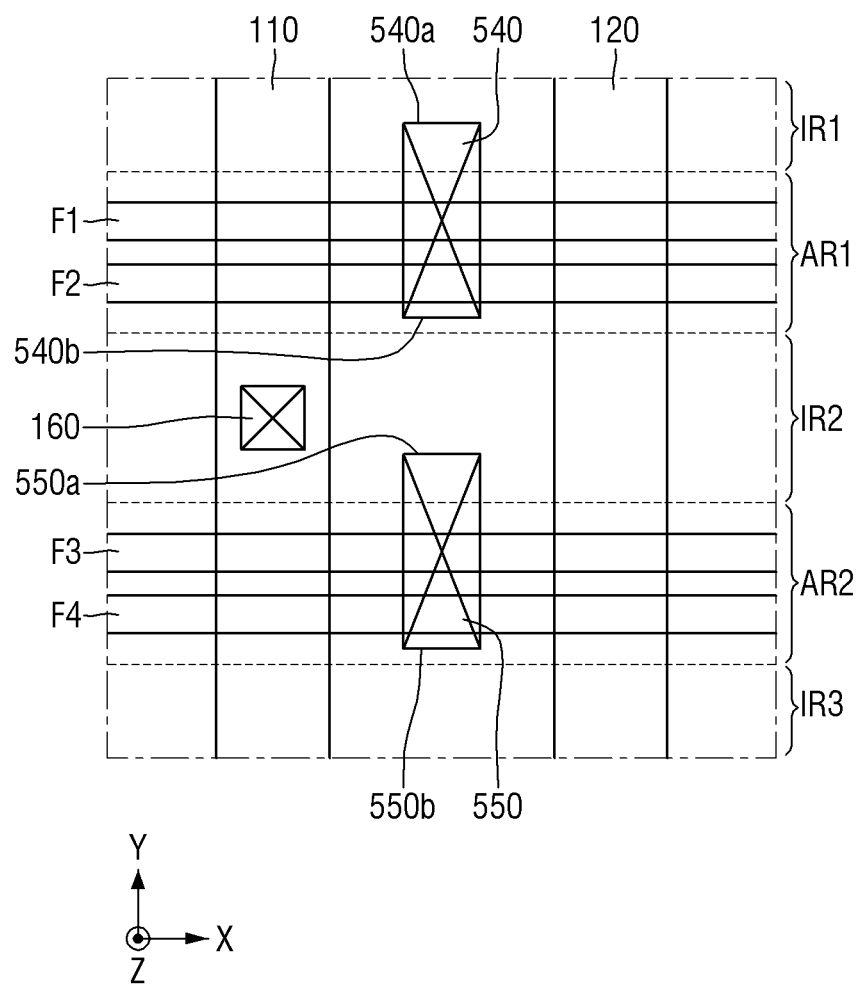
FIG. 10 is a layout diagram illustrating a semiconductor device according to still other embodiments of the present disclosure.

FIG. 10 is a layout diagram illustrating a semiconductor device according to still other embodiments of the present disclosure.

Referring to FIG. 10, in a semiconductor device according to still other embodiments of the present disclosure, a first end 540a of a first source/drain contact 540 may be disposed on the first element isolation region IR1, and a first end 550a of a second source/drain contact 550 may be disposed on the second element isolation region IR2. A second end 540b of the first source/drain contact 540 may be disposed on the first active region AR1, and a second end 550b of the second source/drain contact 550 may be disposed on the second active region AR2.

Hereinafter, a semiconductor device according to still other embodiments of the present disclosure will be described with reference to FIG. 11. Differences relative to the semiconductor device shown in FIGS. 1 to 4 will be mainly described.

Figure 11:
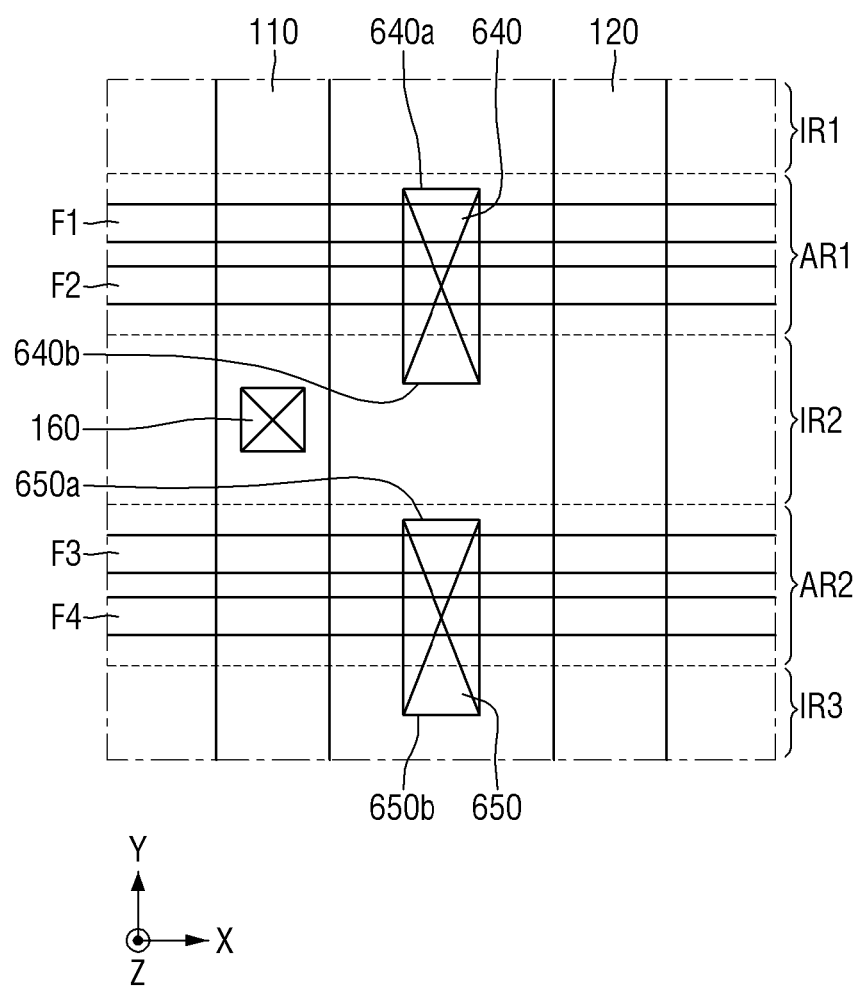
FIG. 11 is a layout diagram illustrating a semiconductor device according to still other embodiments of the present disclosure.

FIG. 11 is a layout diagram illustrating a semiconductor device according to still other embodiments of the present disclosure.

Referring to FIG. 11, in a semiconductor device according to still other embodiments of the present disclosure, a second end 640b of a first source/drain contact 640 may be disposed on the second element isolation region IR2, and a second end 650b of a second source/drain contact 650 may be disposed on the third element isolation region IR3. A first end 640a of the first source/drain contact 640 may be disposed on the first active region AR1, and a first end 650a of the second source/drain contact 650 may be disposed on the second active region AR2.

Hereinafter, a semiconductor device according to still other embodiments of the present disclosure will be described with reference to FIG. 12. Differences relative to the semiconductor device shown in FIGS. 1 to 4 will be mainly described.

Figure 12:
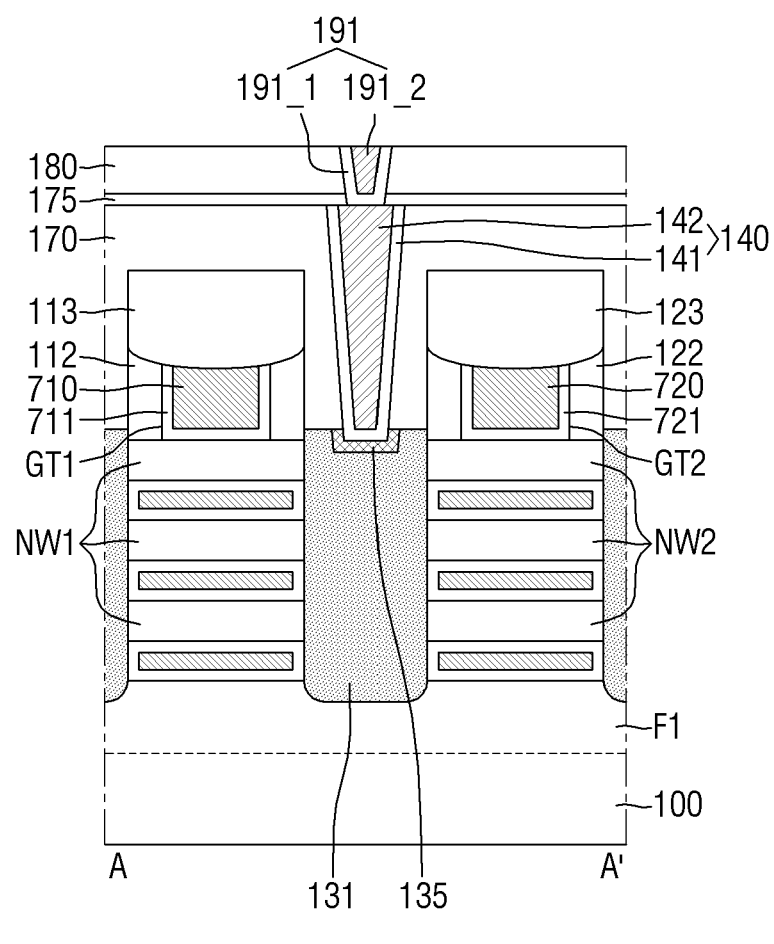
FIG. 12 is a cross-sectional view illustrating a semiconductor device according to still other embodiments of the present disclosure.

FIG. 12 is a cross-sectional view illustrating a semiconductor device according to still other embodiments of the present disclosure.

Referring to FIG. 12, in a semiconductor device according to still other embodiments of the present disclosure, the internal spacers 114 and 124 in FIG. 2 are not provided.

The width in the first direction X of a first gate electrode 710 disposed between the first plurality of nanowires NW1 may be greater than the width in the first direction X of the first gate electrode 710 disposed inside the first gate trench GT1. In addition, the width in the first direction X of a second gate electrode 720 disposed between the second plurality of nanowires NW2 may be greater than the width in the first direction X of the second gate electrode 720 disposed inside the second gate trench GT2. Each of a first gate insulating layer 711 and a second gate insulating layer 721 may contact the first source/drain region 131.

Hereinafter, a semiconductor device according to still other embodiments of the present disclosure will be described with reference to FIG. 13. Differences relative to the semiconductor device shown in FIGS. 1 to 4 will be mainly described.

Figure 13:
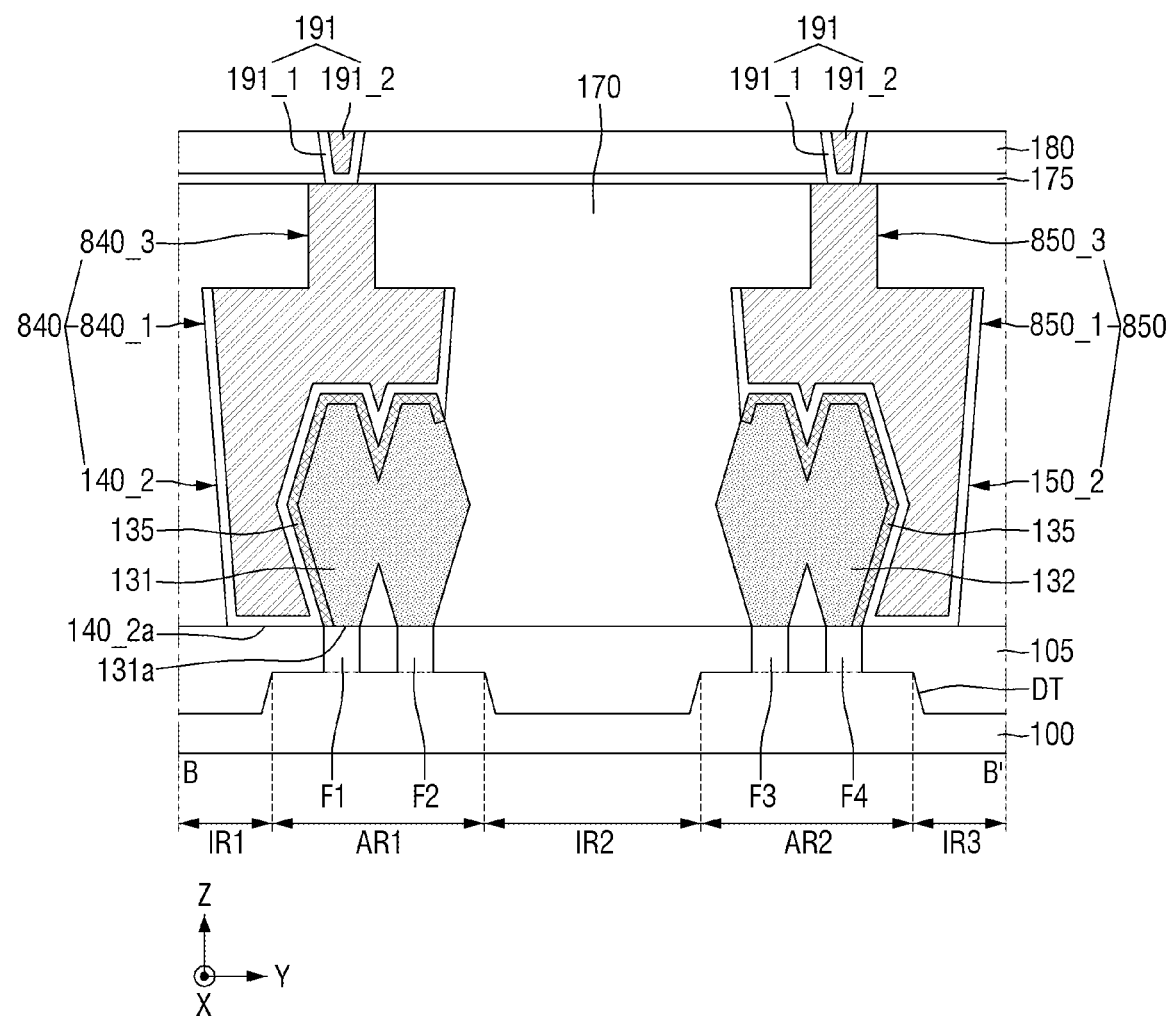
FIG. 13 is a cross-sectional view illustrating a semiconductor device according to still other embodiments of the present disclosure.

FIG. 13 is a cross-sectional view illustrating a semiconductor device according to still other embodiments of the present disclosure.

Referring to FIG. 13, in a semiconductor device according to still other embodiments of the present disclosure, a first source/drain contact 840 may include a third portion 840_3 protruding in the vertical direction Z, and a second source/drain contact 850 may include a third portion 850_3 protruding in the vertical direction Z.

A first portion 840_1 of the first source/drain contact 840 may be disposed on the top surface of the first source/drain region 131. The second portion 140_2 of the first source/drain contact 840 may extend from the first portion 840_1 of the first source/drain contact 840 to the field insulating layer 105 along the sidewall of the first source/drain region 131. The third portion 850_3 of the first source/drain contact 840 may protrude from the first portion 840_1 thereof in the vertical direction Z. The width of the third portion 840_3 of the first source/drain contact 840 in the second direction Y may be smaller than the width of the first portion 840_1 of the first source/drain contact 840 in the second direction Y.

A first portion 850_1 of the second source/drain contact 850 may be disposed on the top surface of the second source/drain region 132. The second portion 150_2 of the second source/drain contact 850 may extend from the first portion 850_1 of the second source/drain contact 850 to the field insulating layer 105 along the sidewall of the second source/drain region 132. The third portion 850_3 of the second source/drain contact 850 may protrude from the first portion 850_1 of the second source/drain contact 850 in the vertical direction Z. The width in the second direction Y of the third portion 850_3 of the second source/drain contact 850 may be smaller than the width in the second direction Y of the first portion 850_1 of the second source/drain contact 850.

The first via 191 may be disposed on each of the third portion 840_3 of the first source/drain contact 840 and the third portion 850_3 of the second source/drain contact 850. The first via 191 may be electrically connected to each of the third portion 840_3 of the first source/drain contact 840 and the third portion 850_3 of the second source/drain contact 850.

Hereinafter, a semiconductor device according to still other embodiments of the present disclosure will be described with reference to FIG. 14. Differences relative to the semiconductor device shown in FIGS. 1 to 4 will be mainly described.

Figure 14:
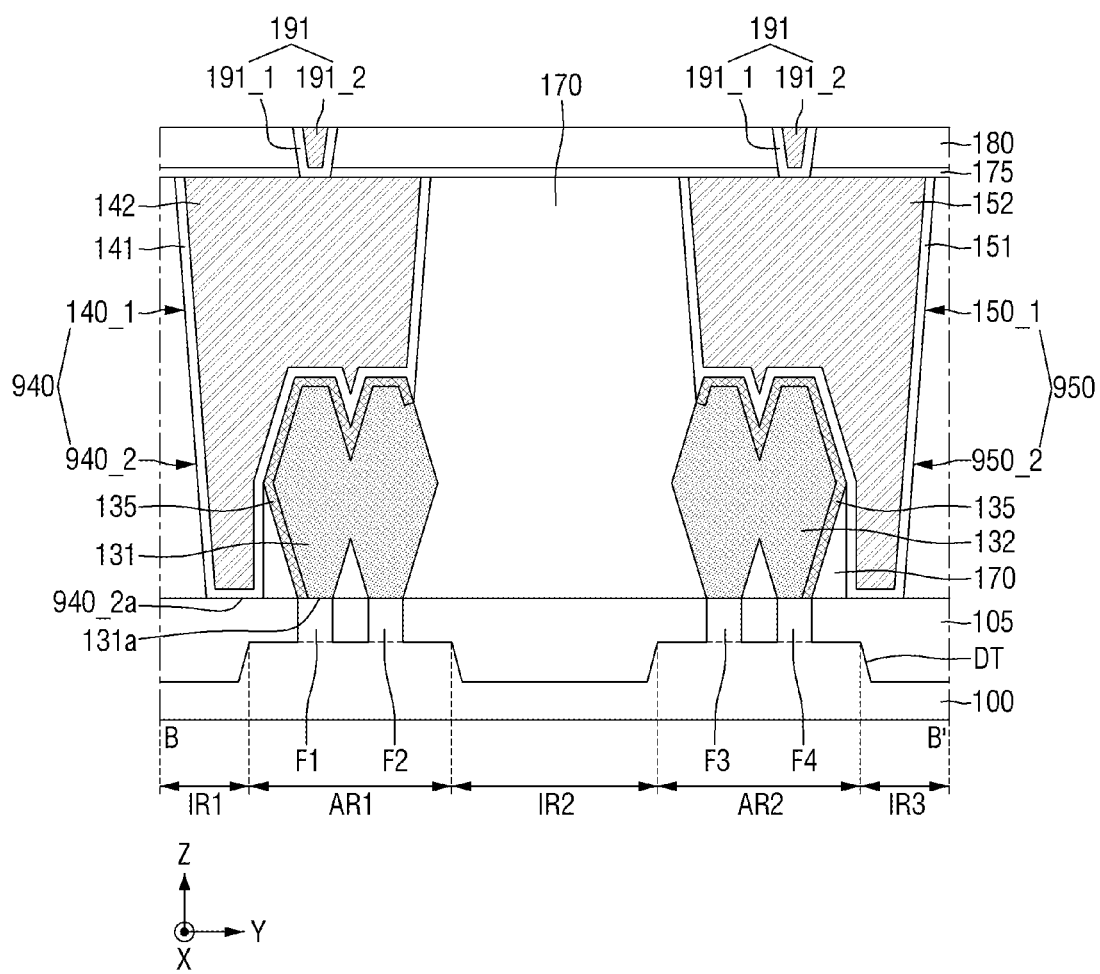
FIG. 14 is a cross-sectional view illustrating a semiconductor device according to still other embodiments of the present disclosure.

FIG. 14 is a cross-sectional view illustrating a semiconductor device according to still other embodiments of the present disclosure.

Referring to FIG. 14, in a semiconductor device according to still other embodiments of the present disclosure, at least a part of a second portion 940_2 of a first source/drain contact 940 may be spaced apart from the first source/drain region 131. In addition, at least a part of a second portion 950_2 of a second source/drain contact 950 may be spaced apart from the second source/drain region 132.

The first interlayer insulating layer 170 may be disposed between the second portion 940_2 of the first source/drain contact 940 and the first source/drain region 131. The first interlayer insulating layer 170 may be disposed between the second portion 950_2 of the second source/drain contact 950 and the second source/drain region 132.

Hereinafter, a semiconductor device according to still other embodiments of the present disclosure will be described with reference to FIG. 15. Differences relative to the semiconductor device shown in FIGS. 1 to 4 will be mainly described.

Figure 15:
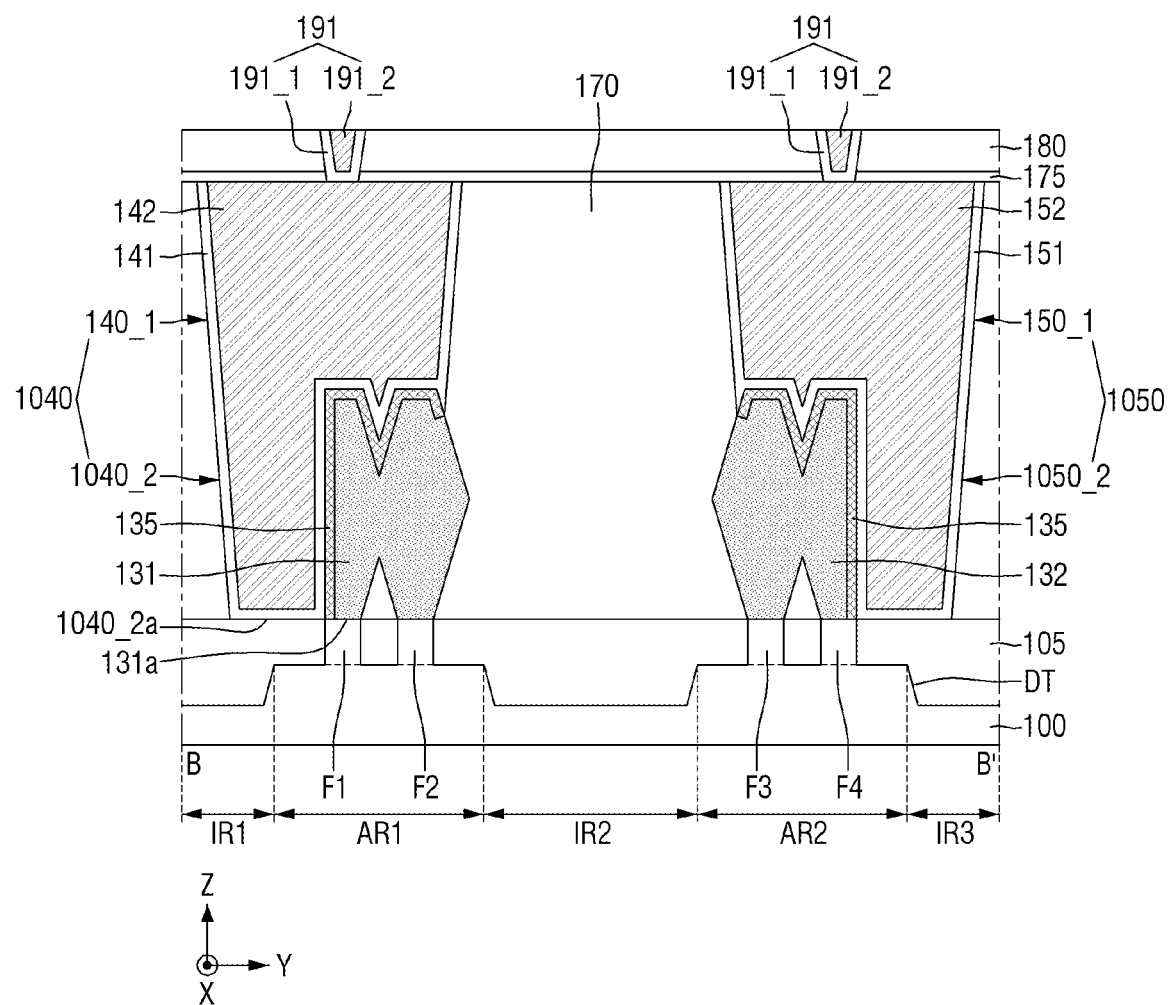
FIG. 15 is a cross-sectional view illustrating a semiconductor device according to still other embodiments of the present disclosure.

FIG. 15 is a cross-sectional view illustrating a semiconductor device according to still other embodiments of the present disclosure.

Referring to FIG. 15, in a semiconductor device according to still other embodiments of the present disclosure, the sidewall of a second portion 1040_2 of a first source/drain contact 1040 adjacent to the first source/drain region 131 may have a constant slope profile, e.g., may be perpendicular to a bottom of the substrate 100. In addition, the sidewall of a second portion 1050_2 of a second source/drain contact 1050 adjacent to the second source/drain region 132 may have a constant slope profile, e.g., may be perpendicular to a bottom of the substrate 100. In a process of etching a trench so as to form each of the first source/drain contact 1040 and the second source/drain contact 1050, a part of the first source/drain region 131 and a part of the second source/drain region 132 may be etched to form the first source/drain contact 1040 and the second source/drain contact 1050 shown in FIG. 15.

Hereinafter, a method for fabricating a semiconductor device according to some embodiments of the present disclosure will be described with reference to FIGS. 16 to 25. FIGS. 16 to 25 are diagrams of stages in a method for fabricating a semiconductor device according to some embodiments of the present disclosure.

Figure 16:
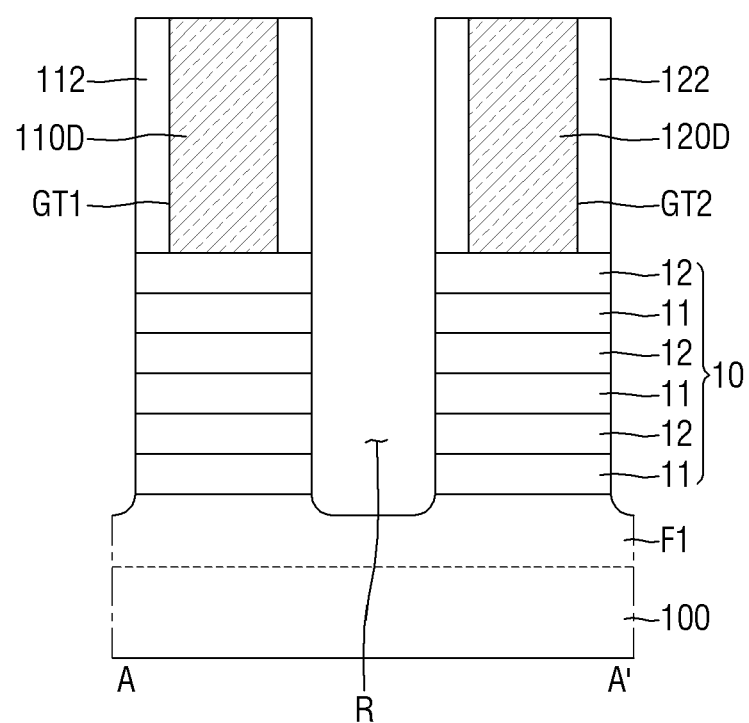
FIGS. 16 to 25 are diagrams of stages in a method for fabricating a semiconductor device according to some embodiments of the present disclosure.
Figure 16:
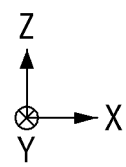
Figure 17:
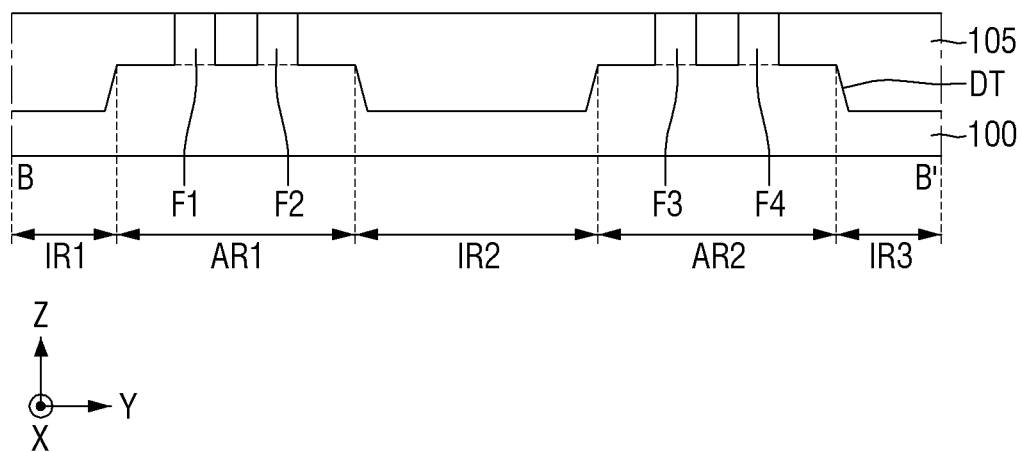

Referring to FIGS. 16 and 17, the first and second active regions AR1 and AR2 may be defined by forming the first to third element isolation regions IR1, IR2, and IR3 on the substrate 100. Subsequently, the first to fourth fin-shaped patterns F1, F2, F3, and F4 extending, e.g., lengthwise, in the first direction X may be formed on the substrate 100. Thereafter, a stacked structure 10, in which first semiconductor layers 11 and second semiconductor layers 12 are alternately stacked, may be formed on the first fin-shaped pattern F1.

Thereafter, a first dummy gate 110D and a second dummy gate 120D may be formed on the first fin-shaped pattern F1 and the field insulating layer 105, and may extend, e.g., lengthwise, in the second direction Y. The second dummy gate 120D may be spaced apart from the first dummy gate 110D in the first direction X. The first gate spacers 112 may be formed along both sidewalls of the first dummy gate 110D, and the second gate spacers 122 may be formed along both sidewalls of the second dummy gate 120D. Subsequently, a recess R may be formed by etching the stacked structure 10 using the first dummy gate 110D and the second dummy gate 120D as a mask.

Figure 18:
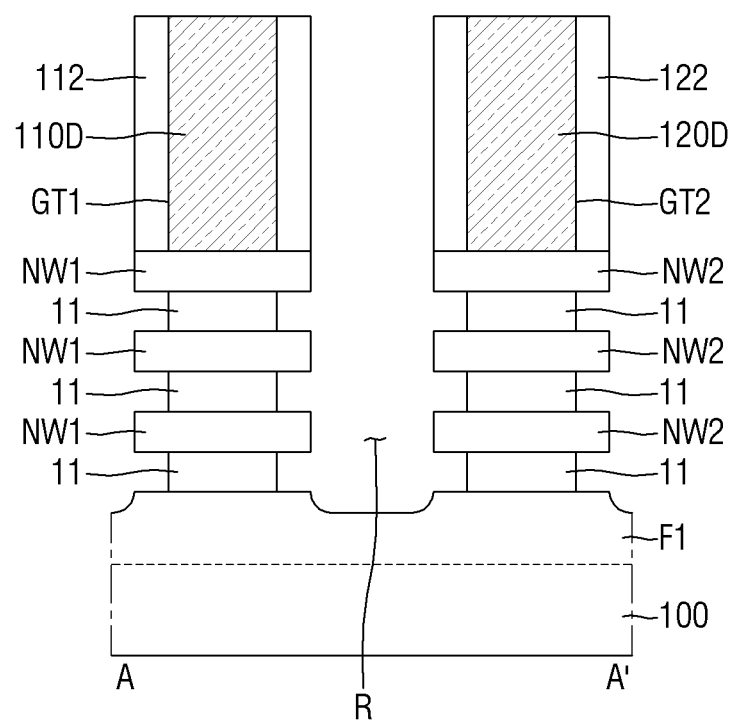
Figure 19:
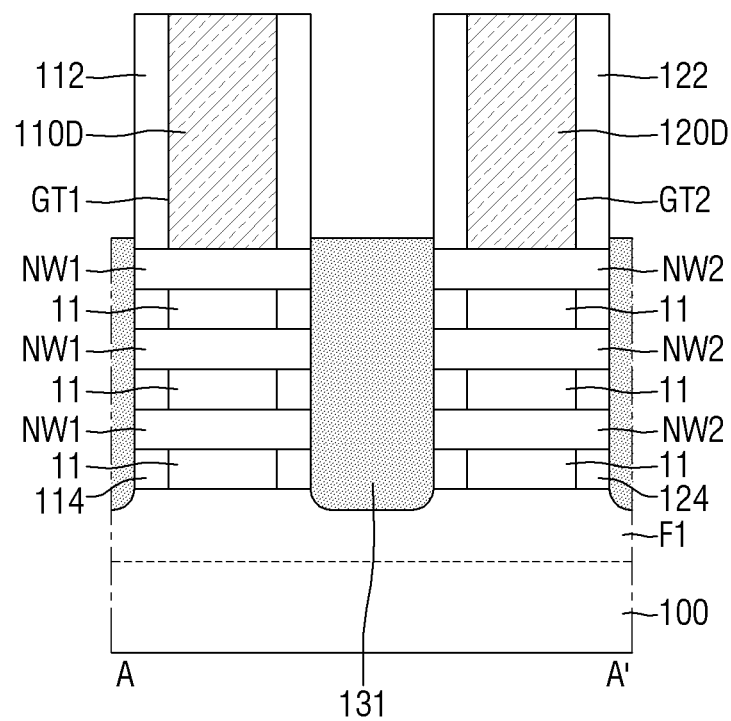
Figure 20:
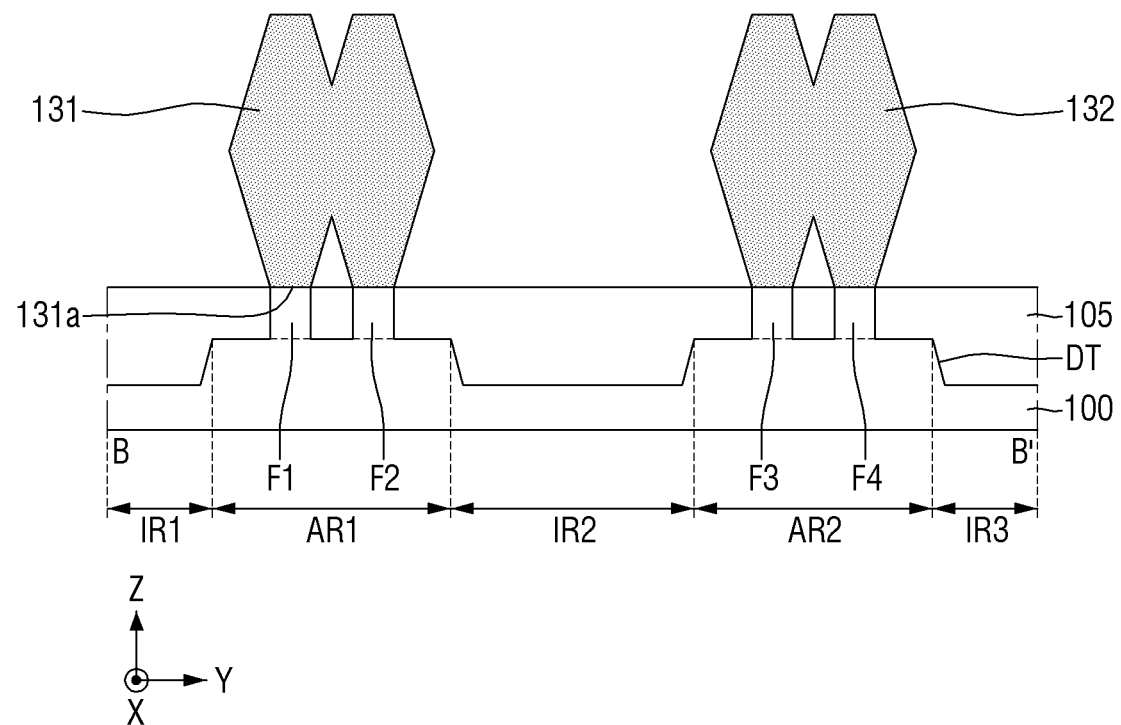
Figure 21:
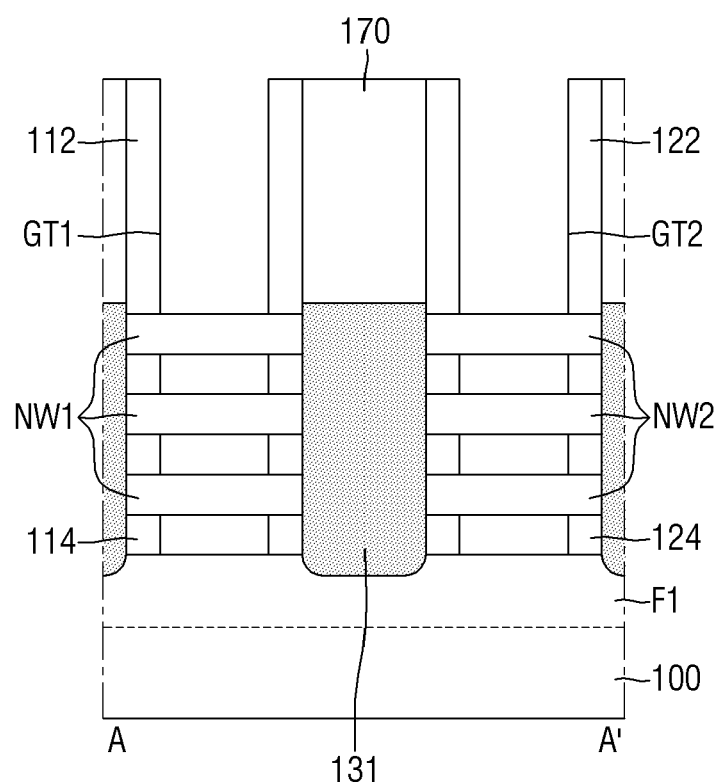
Figure 22:
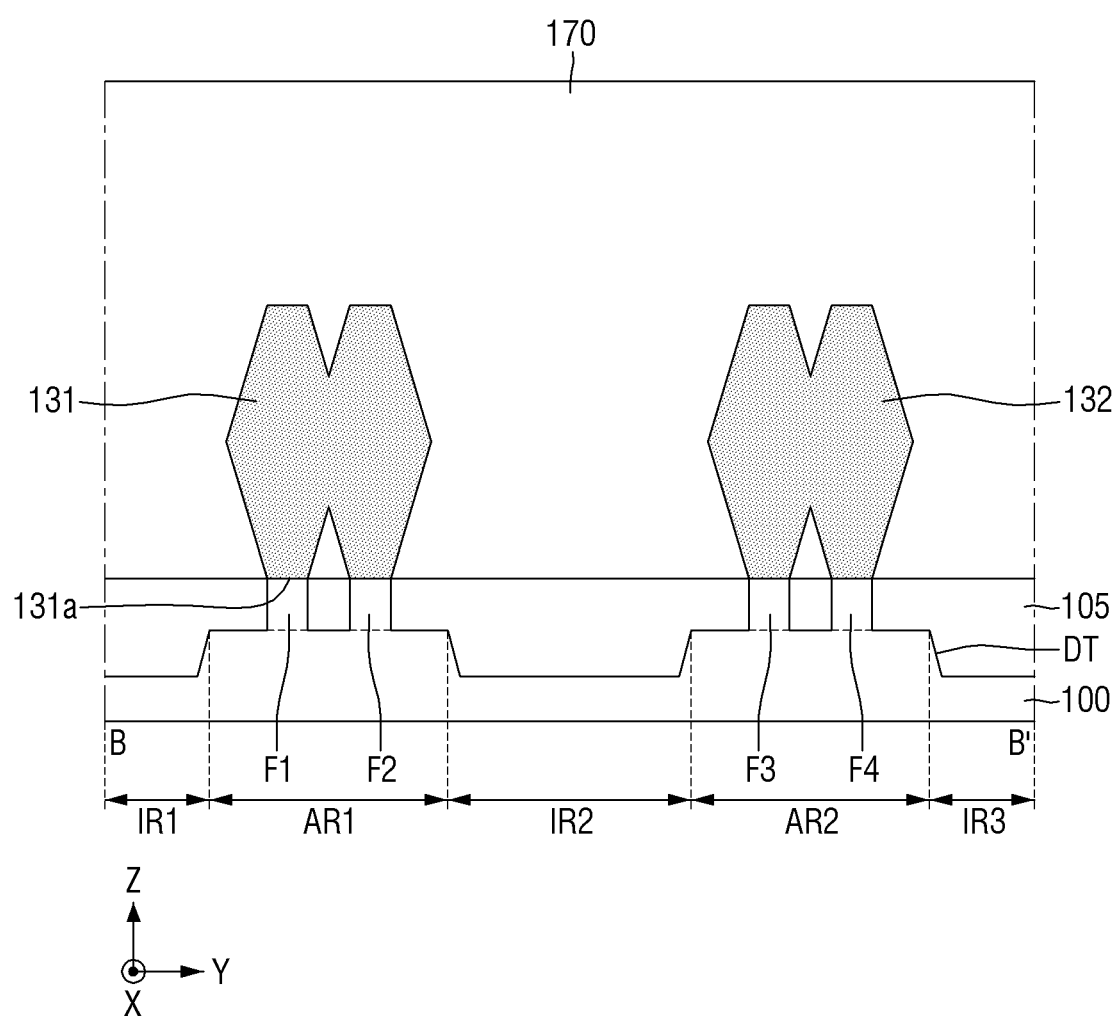

Referring to FIG. 18, the second semiconductor layers 12 etched under the first dummy gate 110D may be defined as the first plurality of nanowires NW1. In addition, the second semiconductor layers 12 etched under the second dummy gate 120D may be defined as the second plurality of nanowires NW2. Each of the first semiconductor layers 11 exposed through the recess R may be partially etched.

Referring to FIGS. 19 to 22, the first internal spacers 114 may be formed in the portions where the first semiconductor layers 11 are partially etched under the first dummy gate 110D. In addition, the second internal spacers 124 may be formed in the portions where the first semiconductor layers 11 are partially etched under the second dummy gate 120D.

Subsequently, the source/drain region may be formed in the recess R. Specifically, the first source/drain region 131 may be formed in the recess R formed on the first active region AR1, and the second source/drain region 132 may be formed in the recess R formed on the second active region AR2.

Then, the first interlayer insulating layer 170 may be formed to cover the first dummy gate 110D, the second dummy gate 120D, the first source/drain region 131, the second source/drain region 132, and the field insulating layer 105. Subsequently, a planarization process (e.g., a chemical mechanical planarization (CMP) process) may be performed to expose the top surfaces of the first dummy gate 110D and the second dummy gate 120D. Subsequently, the first dummy gate 110D, the second dummy gate 120D, and the first semiconductor layers 11 may be removed.

Figure 23:
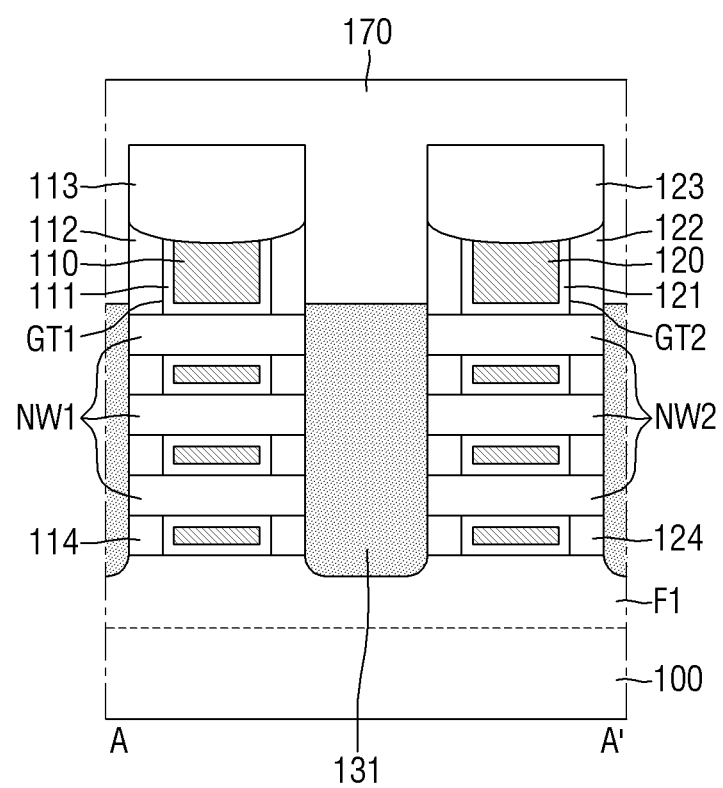

Referring to FIG. 23, the first capping pattern 113, the first gate electrodes 110, and the first gate insulating layers 111 may be formed in the portions from which the first dummy gate 110D and the first semiconductor layers 11 under the first dummy gate 110D have been removed. In addition, the second capping pattern 123, the second gate electrodes 120, and the second gate insulating layers 121 may be formed in the portions from which the second dummy gate 120D and the first semiconductor layers 11 under the second dummy gate 120D have been removed. Subsequently, after performing a planarization process (e.g., CMP process), the first interlayer insulating layer 170 may be additionally formed to cover the first capping pattern 113 and the second capping pattern 123.

Figure 24:
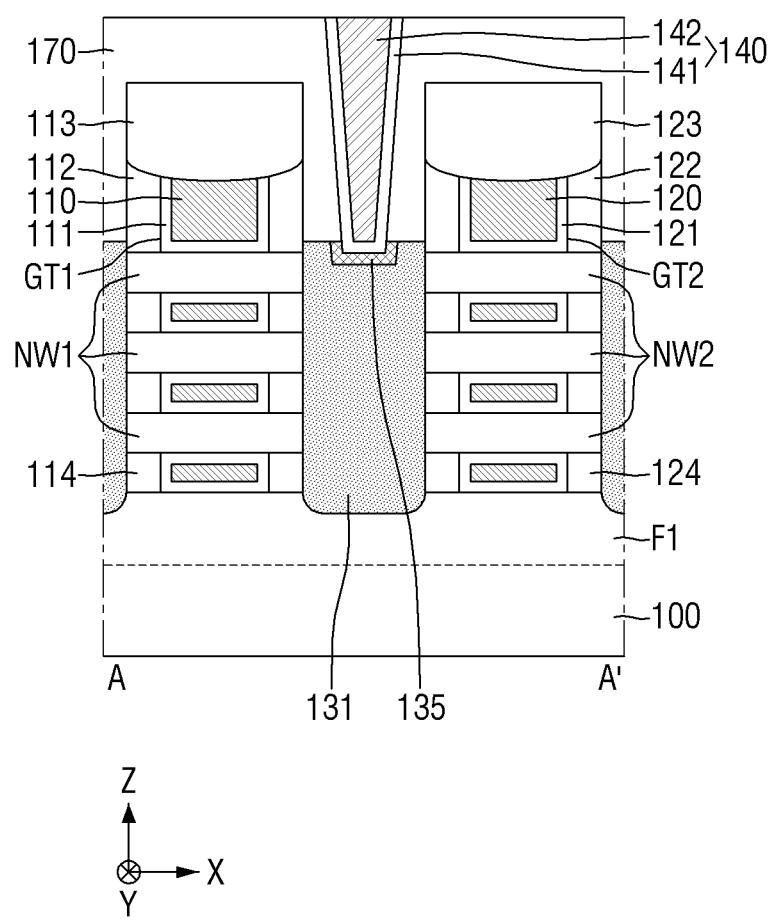
Figure 25:
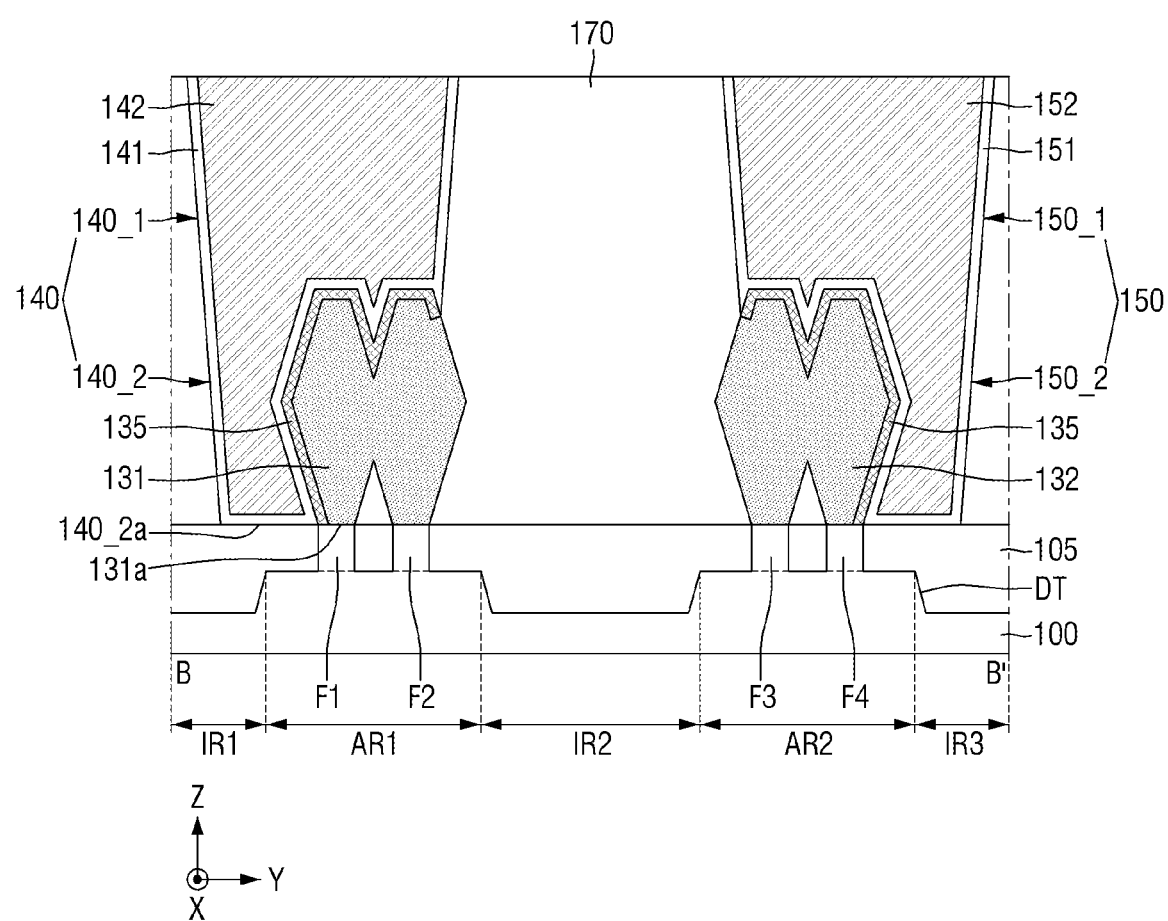

Referring to FIGS. 24 and 25, on the first active region AR1 and the first element isolation region IR1, the first interlayer insulating layer 170 may be etched to form a first contact trench for exposing the first source/drain region 131. In addition, on the second active region AR2 and the third element isolation region IR3, the first interlayer insulating layer 170 may be etched to form a second contact trench for exposing the second source/drain region 132.

Subsequently, the silicide layer 135 may be formed on each of the first source/drain region 131 exposed by the first contact trench and the second source/drain region 132 exposed by the second contact trench. Thereafter, the first source/drain contact 140 may be formed in the first contact trench, and the second source/drain contact 150 may be formed in the second contact trench.

Referring to FIGS. 1 to 4, the gate contact 160 penetrating the first interlayer insulating layer 170 and the first capping pattern 113 in the vertical direction Z may be formed on the first gate electrode 110. Subsequently, the etch stop layer 175 and the second interlayer insulating layer 180 may be sequentially formed on the first interlayer insulating layer 170. Thereafter, each of the first via 191 and the second via 192 penetrating the etch stop layer 175 and the second interlayer insulating layer 180 in the vertical direction Z may be formed.

By way of summation and review, as a pitch (size) of a semiconductor decreases, there is a need to decrease capacitance and secure electrical stability between contacts in the semiconductor device. Therefore, embodiments provide a semiconductor device with improved performance in which the flow of current is improved by extending at least a part of a source/drain contact into an element isolation region, in a multi-bridge channel field effect transistor (MBCFET™) structure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first element isolation region and a second element isolation region;
a first active region along a first direction between the first element isolation region and the second element isolation region;
a first fin-shaped pattern extending in the first direction on the first active region;
first nanowires extending in the first direction on the first fin-shaped pattern;
a gate electrode extending in a second direction different from the first direction on the first fin-shaped pattern, the gate electrode surrounding the first nanowires;
a first source/drain region on at least one side of the gate electrode, the first source/drain region being on the first active region and in contact with each of the first nanowires; and
a first source/drain contact on the first source/drain region, the first source/drain contact including:
a first portion on a top surface of the first source/drain region, and
a second portion extending toward the first active region along a sidewall of the first source/drain region, a first end of the first source/drain contact in the second direction on a plane defined by the first and second directions being on one of the first and second element isolation regions, and a second end opposite the first end in the second direction being on the first active region.

2. The semiconductor device as claimed in claim 1, wherein a bottom surface of the second portion of the first source/drain contact is on a same plane as a bottom surface of the first source/drain region.

3. The semiconductor device as claimed in claim 1, wherein the first end is on the first element isolation region, and the second end is horizontally spaced apart from the second element isolation region.

4. The semiconductor device as claimed in claim 1, wherein the first end is on the first element isolation region, and the second end is vertically aligned with a boundary line between the first active region and the second element isolation region.

5. The semiconductor device as claimed in claim 1, wherein the first source/drain contact further includes a third portion protruding in a vertical direction from the first portion of the first source/drain contact, a width of the third portion of the first source/drain contact in the second direction being smaller than a width of the first portion of the first source/drain contact in the second direction.

6. The semiconductor device as claimed in claim 5, further comprising a via on the third portion of the first source/drain contact, the via being electrically connected to the first source/drain contact.

7. The semiconductor device as claimed in claim 1, wherein the second portion of the first source/drain contact extends along a profile of the sidewall of the first source/drain region.

8. The semiconductor device as claimed in claim 1, wherein at least a part of the second portion of the first source/drain contact is spaced apart from the sidewall of the first source/drain region.

9. The semiconductor device as claimed in claim 1, wherein a sidewall of the second portion of the first source/drain contact adjacent to the first source/drain region has a constant slope profile.

10. The semiconductor device as claimed in claim 1, further comprising:
a third element isolation region spaced apart from the second element isolation region in the second direction;
a second active region between the second element isolation region and the third element isolation region;
a second fin-shaped pattern extending in the first direction on the second active region;
second nanowires extending in the first direction on the second fin-shaped pattern, the gate electrode surrounding the second nanowires;
a second source/drain region on at least one side of the gate electrode on the second active region, the second source/drain region being in contact with the second nanowires; and
a second source/drain contact on the second source/drain region, an end of the second source/drain contact in the second direction on a plane defined by the first and second directions being on one of the first and second element isolation regions.

11. A semiconductor device, comprising:
a first element isolation region, a second element isolation region, and a third element isolation region;
a first active region between the first element isolation region and the second element isolation region, the first active region extending in a first direction;
a second active region between the second element isolation region and the third element isolation region, the second active region extending in the first direction;
first nanowires extending in the first direction on the first active region;
second nanowires extending in the first direction on the second active region;
a gate electrode extending in a second direction different from the first direction on the first and second active region, the gate electrode surrounding the first nanowires and the second nanowires;
a first source/drain contact on at least one side of the gate electrode on the first active region, a first end of the first source/drain contact in the second direction on a plane defined by the first and second directions being on one of the first and second element isolation regions, and a second end opposite the first end in the second direction being on the first active region; and
a second source/drain contact spaced apart from the first source/drain contact in the second direction on the second active region, a first end of the second source/drain contact in the second direction on a plane defined by the first and second directions being on one of the second and third element isolation regions.

12. The semiconductor device as claimed in claim 11, wherein the first end of the first source/drain contact is on the first element isolation region.

13. The semiconductor device as claimed in claim 12, wherein the second end of the first source/drain contact is spaced apart from the second element isolation region.

14. The semiconductor device as claimed in claim 12, wherein the second end of the first source/drain contact is vertically aligned with a boundary line between the first active region and the second element isolation region.

15. The semiconductor device as claimed in claim 11, wherein the first end of the first source/drain contact is vertically aligned with a boundary line between the first active region and the first element isolation region.

16. The semiconductor device as claimed in claim 11, wherein the first end of the second source/drain contact is on the second element isolation region.

17. The semiconductor device as claimed in claim 11, wherein a second end of the second source/drain contact is on the third element isolation region.

18. A semiconductor device, comprising:
- a first element isolation region, a second element isolation region, and a third element isolation region;
- a first active region between the first element isolation region and the second element isolation region, the first active region extending in a first direction;
- a second active region between the second element isolation region and the third element isolation region, the second active region extending in the first direction;
- first nanowires extending in the first direction on the first active region;
- second nanowires extending in the first direction on the second active region;
- a gate electrode extending in a second direction different from the first direction on the first and second active region, the gate electrode surrounding the first nanowires and the second nanowires;
- a first source/drain region disposed on at least one side of the gate electrode on the first active region;
- a second source/drain region disposed on at least one side of the gate electrode on the second active region;
- a first source/drain contact on the first source/drain region, a first end of the first source/drain contact in the second direction on a plane defined by the first and second directions being on one of the first and second element isolation regions, a second end opposite the first end in the second direction being on the first active region, and a lowermost surface of the first source/drain contact being on a same plane as a bottom surface of the first source/drain region; and
- a second source/drain contact on the second source/drain region, an end of the second source/drain contact in the second direction on a plane defined by the first and second directions being on one of the second and third element isolation regions.

\* \* \* \* \*